US008008670B2

(12) United States Patent
Honda

(10) Patent No.: US 8,008,670 B2
(45) Date of Patent: Aug. 30, 2011

(54) LIGHT EMITTING DEVICE

(75) Inventor: Tatsuya Honda, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 524 days.

(21) Appl. No.: 11/674,410

(22) Filed: Feb. 13, 2007

(65) Prior Publication Data

US 2007/0194334 A1 Aug. 23, 2007

(30) Foreign Application Priority Data

Feb. 21, 2006 (JP) ................................ 2006-043624

(51) Int. Cl.
*H01L 33/00* (2006.01)

(52) U.S. Cl. ..................... 257/79; 257/91; 257/E33.001

(58) Field of Classification Search .................... 257/13, 257/21, 79, 80, 82, E25.032, 91, E33.001, 257/E27.12

See application file for complete search history.

(56) References Cited

U.S. PATENT DOCUMENTS 4,916,496 A * 4/1990 Tomomura et al. ............. 257/78
5,021,857 A * 6/1991 Suehiro ......................... 257/392
5,274,248 A 12/1993 Yokogawa et al.
5,523,589 A * 6/1996 Edmond et al. ................. 257/77
5,963,787 A * 10/1999 Kimura et al. .................. 438/46
7,151,338 B2 12/2006 Hoffman
7,345,297 B2 * 3/2008 Yamazoe et al. ................ 257/12
2002/0105004 A1 * 8/2002 Hori et al. ....................... 257/99
2003/0040137 A1 2/2003 Kim et al.
2005/0062411 A1 * 3/2005 Valentine et al. ............. 313/506
2005/0073246 A1 4/2005 Hoffman
2006/0011908 A1 * 1/2006 Ohsawa et al. ................. 257/40
2006/0043410 A1 * 3/2006 Iwasaki et al. ................ 257/103
2006/0086932 A1 * 4/2006 Kim et al. ........................ 257/13
2007/0029640 A1 * 2/2007 Isono et al. ................... 257/615
2007/0072439 A1 3/2007 Akimoto et al.
2007/0108446 A1 5/2007 Akimoto
2007/0187697 A1 * 8/2007 Wu et al. ......................... 257/79
2008/0308796 A1 12/2008 Akimoto et al.
2008/0308797 A1 12/2008 Akimoto et al.
2008/0308804 A1 12/2008 Akimoto et al.
2008/0308805 A1 12/2008 Akimoto et al.
2008/0308806 A1 12/2008 Akimoto et al.

(Continued)

FOREIGN PATENT DOCUMENTS

EP 1521505 A1 4/2005

(Continued)

OTHER PUBLICATIONS

European Search Report, issued in EP 07003057.2, dated Jun. 4, 2010, 5 pages.

*Primary Examiner* — Thao P. Le

(74) *Attorney, Agent, or Firm* — Fish & Richardson P.C.

(57) ABSTRACT

An object is to provide a light emitting element using an inorganic compound as a light emitting material, which has ever-higher luminous efficiency and can be driven with low voltage. The chance of excitation of light emitting centers (atoms) in a light emitting layer is increased to enhance luminous efficiency by providing a carrier supply layer in order to increase the number of carries in the light emitting layer of a light emitting element using an inorganic compound, and drive voltage of the light emitting element or a light emitting device is reduced.

18 Claims, 15 Drawing Sheets

U.S. PATENT DOCUMENTS

| | | | | |
|---|---|---|---|---|
| 2009/0008639 | A1 | 1/2009 | Akimoto et al. | |
| 2009/0184329 | A1 * | 7/2009 | Miki et al. | 257/79 |

FOREIGN PATENT DOCUMENTS

| | | | |
|---|---|---|---|
| JP | 2001-250691 | | 9/2001 |
| JP | 2002-118330 | | 4/2002 |
| JP | 2004-221132 | | 8/2004 |
| JP | 2005038634 | A | 2/2005 |
| JP | 2007096055 | A | 4/2007 |
| JP | 2007123861 | A | 5/2007 |
| JP | 2007165861 | A | 6/2007 |

* cited by examiner

LIGHT EMITTING DEVICE

BACKGROUND OF THE INVENTION

1. Field of the Invention

The present invention relates to a light emitting element using electroluminescence. The present invention also relates to a light emitting device and an electronic device each including the light emitting element.

2. Description of the Related Art

In recent years, light emitting elements using electroluminescence have been actively researched and developed. In a basic structure of the light emitting element, a light emitting substance is interposed between a pair of electrodes. Light emission from the light emitting substance can be obtained by voltage application between the electrodes.

Such a light emitting element is of a self-light emitting type; therefore, it has advantages over a liquid crystal display in wide viewing angle, excellent visibility, high response speed, and capability of reduction in thickness and weight.

Light emitting elements can be divided into two groups: an organic light emitting element using an organic compound as a light emitting substance, and an inorganic light emitting element using an inorganic compound.

Note that these light emitting elements differ from each other in not only light emitting substance but also light emitting mechanism and characteristic.

Of them, the inorganic light emitting element has a double insulating structure which includes a light emitting layer 1503 interposed between insulating films (a first insulating film 1502 and a second insulating film 1504), between a pair of electrodes (a first electrode 1501 and a second electrode 1505), and provides light emission by application of an alternating voltage between both electrodes (the first electrode 1501 and the second electrode 1505) from respective power sources (a first power source 1506 and a second power source 1507), as shown in FIG. 15.

However, although the inorganic light emitting element has more excellent material reliability than the organic light emitting element, sufficient luminance and the like have not been obtained and various researches have been carried out (for example, see Reference 1: Japanese Published Patent Application No. 2001-250691).

Further, the inorganic light emitting element requires application of a voltage of several-hundred volts to the light emitting element due to its light emitting mechanism which provides light emission through collisional excitation of a light emitting center by electrons accelerated with high electric field. It is important to reduce its drive voltage in order to apply the inorganic light emitting element to a display panel or the like.

SUMMARY OF THE INVENTION

It is an object of the present invention to provide a light emitting element using an inorganic compound as a light emitting material, which has ever-higher luminous efficiency and which can be driven with low voltage.

A conventional light emitting element using an inorganic compound has a light emitting mechanism by which light is emitted as energy when inner-shell electrons of light emitting centers (atoms) excited by collision of carriers in a light emitting layer returns to a ground state. Therefore, one reason for high drive voltage of the light emitting element is that the number of carriers for exciting light emitting centers is insufficient.

On the other hand, a feature of the present invention is to increase the chance of excitation of light emitting centers (atoms) in a light emitting layer to enhance luminous efficiency by providing a carrier supply layer in order to increase the number of carriers in the light emitting layer of a light emitting element using an inorganic compound, and to reduce drive voltage of the light emitting element or a light emitting device.

In specific, a light emitting device of the present invention includes a first electrode; a first insulating film formed over the first electrode; a light emitting layer formed over the first insulating film; a second insulating film formed over the light emitting layer; a second electrode formed over the second insulating film; and a carrier supply layer interposed between the first and second insulating films. The light emitting layer includes at least a base material and an additive material, and the carrier supply layer comprises a semiconductor material which includes at least one of an n-type impurity element and a p-type impurity element.

Note that the present invention includes, in its scope, a structure with a plurality of carrier supply layers. Another light emitting device according to the present invention includes a first electrode; a first insulating film formed over the first electrode; a light emitting layer formed over the first insulating film; a second insulating film formed over the light emitting layer; a second electrode formed over the second insulating film; and a plurality of carrier supply layers interposed between the first and second insulating films.

In addition, the present invention also includes, in its scope, a structure in which the light emitting layer is partially in contact with the carrier supply layer as well as the above-mentioned structures.

In each of the above structures, the base material is one or more of the following materials: a Group 2-Group 16 compound, a Group 12-Group 16 compound, a Group 13-Group 15 compound, a Group 2-Group 13-Group 16 compound, a Group 14 compound, and rare-earth sulfide. More specifically, the base material is one or more of the following materials: calcium sulfide, strontium sulfide, barium sulfide, zinc sulfide, cadmium sulfide, zinc oxide, gallium nitride, strontium gallium sulfide, magnesium zinc oxide, silicon carbide, and yttrium sulfide.

In each of the above structures, the additive material is one or more of transition metal elements and rare-earth elements. More specifically, it is one or more of the following materials: cerium, praseodymium, samarium, europium, terbium, thulium, chromium, iron, cobalt, nickel, copper, silver, gold, platinum, and manganese.

In each of the above structures, the carrier supply layer comprises one of the following materials: zinc sulfide to which indium is added, zinc oxide to which aluminum or gallium is added, gallium nitride to which silicon is added, zinc oxide to which nitrogen or phosphorus is added, and gallium nitride to which zinc is added.

Note that the light emitting device in this specification includes, in its category, an image display device, a light emitting device, and a light source (including a lighting system). Further, the light emitting device includes all of the following modules: a module in which a connector such as an FPC (Flexible Printed Circuit), a TAB (Tape Automated Bonding) tape, or a TCP (Tape Carrier Package) is attached to a panel provided with the light emitting elements described in this specification; a module having a TAB tape or a TCP provided with a printed wiring board at the end thereof; and a module having an IC (Integrated Circuit) directly mounted on a light emitting device by a COG (Chip On Glass) method.

The present invention includes, in its scope, an electronic device using the light emitting device of the present invention in a display portion.

A light emitting element having not only high luminous efficiency and low drive voltage but also high resistance to deterioration can be provided by carrying out the present invention.

DETAILED DESCRIPTION OF THE INVENTION

Embodiment modes of the present invention are hereinafter described in detail with reference to the drawings and the like. Note that the present invention can be embodied in many different modes, and it is easily understood by the skilled person that the mode and the detail of the present invention can be variously changed without deviating from the spirit and the scope thereof. Therefore, the present invention is not interpreted as being limited to the description of the following embodiment modes.

Embodiment Mode 1

This embodiment mode describes a light emitting element of the present invention. Note that it is important in the present invention to sufficiently supply carriers to a light emitting layer in order to increase luminous efficiency of the light emitting element.

Figure 1:
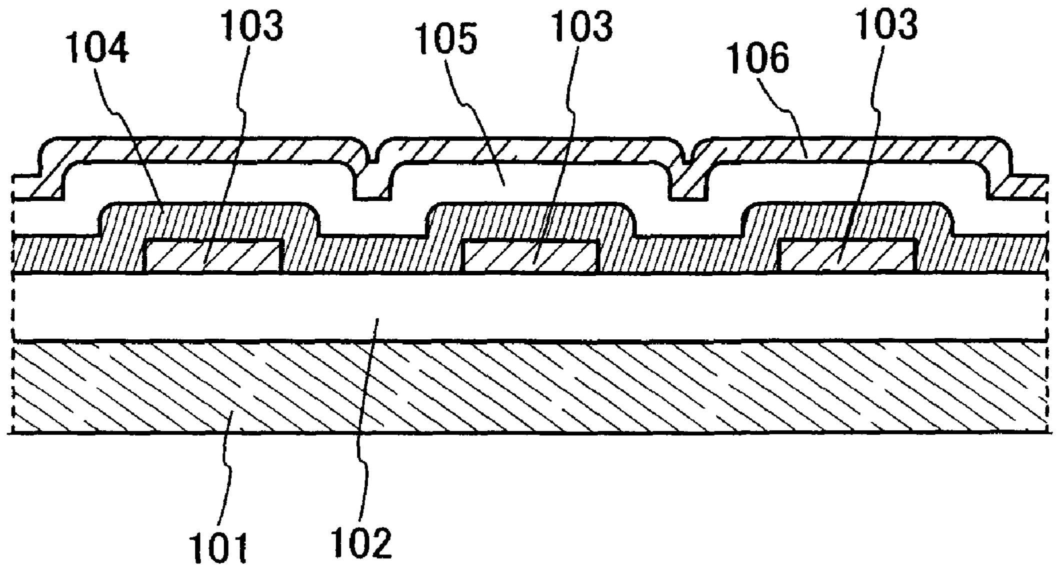
FIG. 1 is a diagram illustrating a light emitting element of the present invention.

The light emitting element of the present invention has a structure shown in FIG. 1. In other words, it has a structure in which a first insulating film 102 is formed of an insulating material over a first electrode 101 made of a conductive material; a plurality of carrier supply layers 103 is partly and separately formed over the first insulating film 102; a light emitting layer 104 is formed so as to be partly in contact with the carrier supply layers 103; a second insulating film 105 is formed of an insulating material over the light emitting layer 104; and a second electrode 106 is formed of a conductive material over the second insulating film 105.

In the present invention, the light emitting layer 104 is formed of a base material that is a semiconductor and an additive material that is a light emitting center. The carrier supply layers 103 are formed by addition of a p-type or n-type impurity element to a semiconductor material. Specific examples of the base material, the additive material, and the p-type or n-type impurity element will be given later in this embodiment mode.

Therefore, in the element structure of the light emitting element of the present invention, the carrier supply layers 103 and the light emitting layer 104 which is formed to be partly in contact with the carrier supply layers 103 are interposed between the first insulating film 102 and the second insulating film 105, and they are further interposed between the first electrode 101 and the second electrode 106 with the first insulating film 102 and the second insulating film 105 interposed therebetween.

When an alternating voltage (of, for example, 10 V to 100 V) is applied between both of the electrodes (the first electrode 101 and the second electrode 106), carriers (electrons) are supplied from the carrier supply layers 103 to the light emitting layer 104. Note that since the carrier concentration (electron concentration) of each carrier supply layer 103 when voltage is applied is much higher than that of the light emitting layer 104, carriers can be efficiently supplied to the light emitting layer 104 and drive voltage can be reduced.

Next, a carrier supply mechanism of the light emitting element is described with reference to band diagrams of FIGS. 2A and 2B. Note that each of FIGS. 2A and 2B shows, as an example, a case of a light emitting element which includes a light emitting layer 201 formed using zinc sulfide (ZnS) as a base material and manganese (Mn) as an additive material and a carrier supply layer 202 formed using indium (In) as an n-type impurity element in a semiconductor material.

Figure 2A:
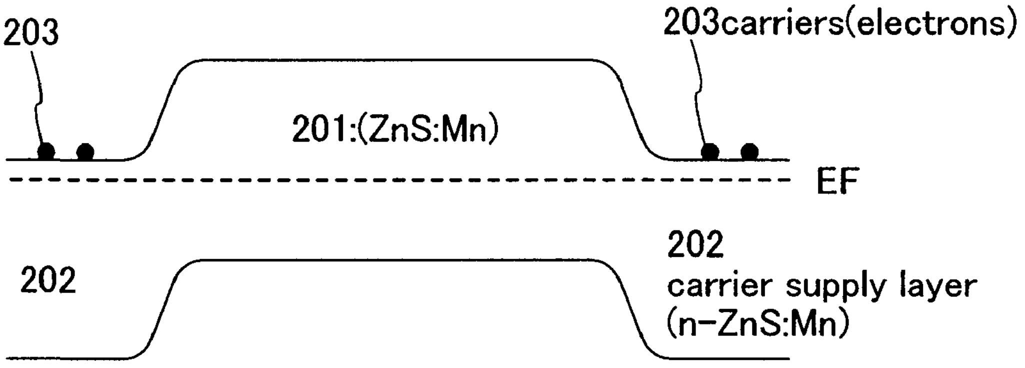
FIGS. 2A and 2B are diagrams illustrating a light emitting element of the present invention.

FIG. 2A is a band diagram showing a state in which voltage is not applied to either of the electrodes of the light emitting element (a thermal equilibrium state). In FIG. 2A, carriers 203 cannot be supplied from the carrier supply layer 202 to the light emitting layer 201 because there is a large difference in work function (hereinafter referred to as a diffusion potential) between substances included in the light emitting layer 201 and the carrier supply layer 202.

Figure 2B:
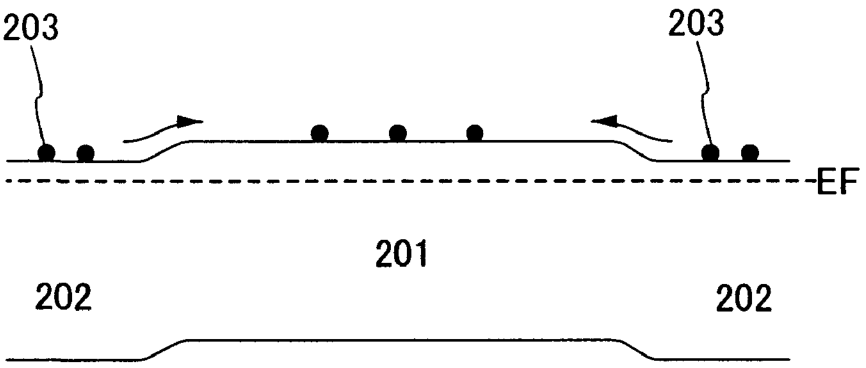

However, the diffusion potential becomes small as shown in FIG. 2B by application of negative voltage to a first electrode (or positive voltage to a second electrode); thus, the carriers 203 can be supplied from the carrier supply layer 202 to the light emitting layer 201.

Therefore, drive voltage can be reduced because carriers can be efficiently supplied to a light emitting layer when a carrier supply layer is formed so as to be partly in contact with the light emitting layer as in the present invention.

Each of the first electrode 101 and the second electrode 106 of the light emitting element of the present invention can be formed using a conductive film including a semiconductor such as Si or Ge; a single-layer conductive film of a metal element such as Ag, Au, Cu, Ni, Pt, Pd, Ir, Rh, W, Al, Ta, Mo, Cd, Zn, Fe, Ti, Zr, Ba, or Nd; a stacked conductive film of a plurality of the above metal elements; a conductive film made of an alloy which includes the metal element as its main component (such as an aluminum-titanium alloy film); a conductive film made of metal nitride using the metal element; or the like.

Alternatively, it may be formed using a conductive film of indium tin oxide (ITO), indium zinc oxide (IZO) formed using a target in which indium oxide containing silicon oxide is mixed with zinc oxide (ZnO) of 2 wt % to 20 wt %, indium tin oxide containing silicon oxide as a component (ITSO), or the like.

Note that the thickness of each of the first electrode 101 and the second electrode 106 is preferably 50 nm to 400 nm, more preferably 100 nm to 250 nm.

Each of the first insulating film 102 and the second insulating film 105 can be formed to have a single-layer or stacked structure using an insulating film containing silicon such as a silicon oxide (for example, $SiO_2$) film, a silicon nitride (for example, $Si_3N_4$) film, a silicon nitride oxide film, or a silicon oxynitride film, or an insulating film of metal oxide (for example, $Al_2O_3$ or $BaTiO_3$) or the like. Note that the thickness of each of the first insulating film 102 and the second insulating film 105 is 10 nm to 250 nm, preferably 100 nm to 200 nm.

The light emitting layer 104 is formed of a base material that is a semiconductor and an additive material that is a light emitting center. Note that the base material can be any of the following materials: a compound including a Group 2 element and Group 16 element of the periodic table (hereinafter referred to as a Group 2-Group 16 compound), a compound including a Group 12 element and a Group 16 element (hereinafter referred to as a Group 12-Group 16 compound), a compound including a Group 13 element and a Group 15 element (hereinafter referred to as a Group 13-Group 15 compound), a compound including a Group 2 (or Group 12 or rare-earth) element, a Group 13 element, and a Group 16 element (hereinafter referred to as a Group 2-Group 13-Group 16 compound), a compound including a plurality of Group 14 elements (hereinafter referred to as a Group 14 compound), a compound including a rare-earth element and sulfur (S) (hereinafter referred to as rare-earth sulfide), a combination thereof, and the like.

Note that examples of the Group 2-Group 16 compound are as follows: calcium sulfide (CaS), strontium sulfide (SrS), barium sulfide (BaS), and the like. Specific examples of the Group 12-Group 16 compound are as follows: zinc sulfide (ZnS), cadmium sulfide (CdS), zinc oxide (ZnO), and the like; the Group 13-Group 15 compound, gallium nitride (GaN) and the like; the Group 2-Group 13-Group 16 compound, strontium gallium sulfide ($SrGa_2S_4$), magnesium zinc oxide ($Mg_xZn_{1-x}O$), and the like; the Group 14 compound, silicon carbide (SiC) and the like; and the rare-earth sulfide, yttrium sulfide ($Y_2S_3$) and the like.

The additive material can be a transition metal, a rare-earth element, or the like. Note that specific examples of the additive material are as follows: cerium (Ce), praseodymium (Pr), samarium (Sm), europium (Eu), terbium (Tb), thulium (Tm), chromium (Cr), iron (Fe), cobalt (Co), nickel (Ni), copper (Cu), silver (Ag), gold (Au), platinum (Pt), manganese (Mn), and the like.

Further, specific examples of a combination of the base material and the additive material (base material:additive material) are as follows: ZnS:Mn, CdSSe:Mn, ZnS:TbOF, ZnS:Tb, SrS:Ce, $SrGa_2S_4$:Ce, and the like.

Note that the composition ratio of the above-mentioned compound does not take an exact value and has a certain degree of solid solubility limit (or a composition range) for each element. Therefore, it is acceptable in the present invention as long as the composition ratio is in that range.

The carrier supply layers 103 can be formed using a semiconductor material (including the above-mentioned semiconductor serving as the base material) which includes an n-type or p-type impurity element.

The n-type impurity element can be as follows: indium (In), aluminum (Al), gallium (Ga), silicon (Si), or the like. The p-type impurity element can be as follows: nitrogen (N), phosphorus (P), zinc (Zn), or the like.

Note that specific examples of a material which is used for the carrier supply layers 103 and is a combination of a semiconductor material and the n-type or p-type impurity element added to the semiconductor material are as follows: n-type ZnS in which an n-type impurity element. In, is added to a semiconductor material, ZnS; n-type ZnO in which an n-type impurity element, Al or Ga, is added to a semiconductor material, ZnO; n-type GaN in which an n-type impurity element, Si, is added to a semiconductor material, GaN; p-type ZnO in which a p-type impurity element, N or P, is added to a semiconductor material, ZnO; p-type GaN in which a p-type impurity element, Zn, is added to a semiconductor material, GaN; and the like.

In the light emitting element of the present invention having the above-described structure, the efficiency of carrier supply to the light emitting layer can be increased due to the carrier supply layers provided so as to be partly in contact with the light emitting layer, so that drive voltage thereof can be reduced.

Embodiment Mode 2

This embodiment mode describes the principle of carrier supply in a case of driving the light emitting element of the present invention.

Figure 3:
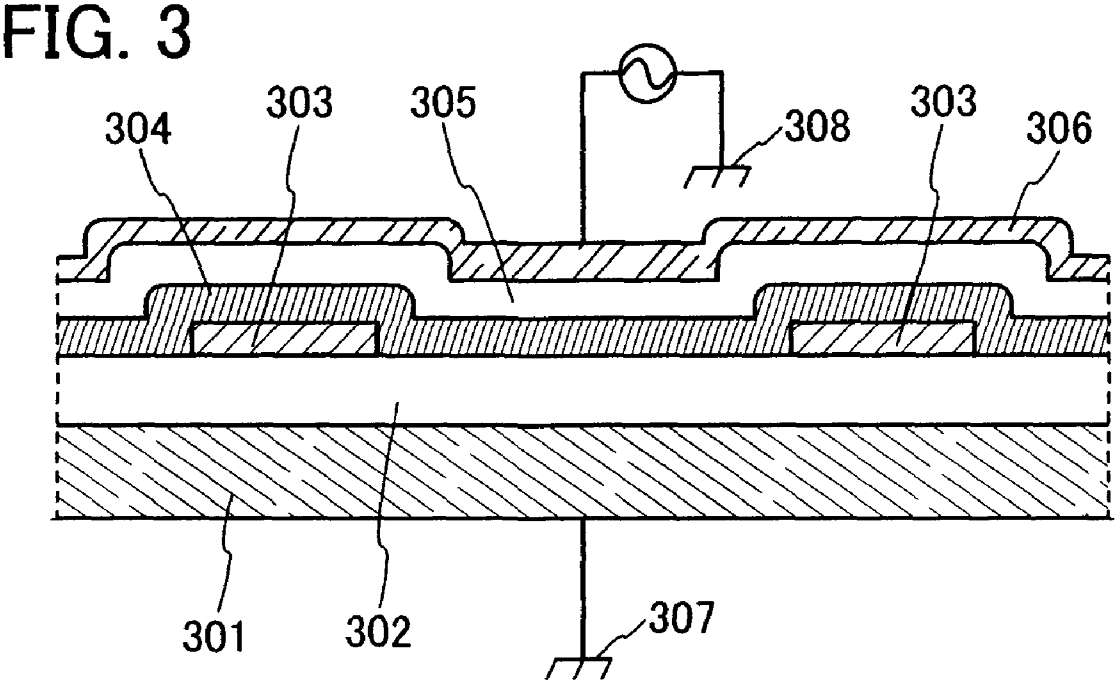
FIG. 3 is a diagram illustrating a light emitting element of the present invention.

FIG. 3 shows a structure of the light emitting element of the present invention. The light emitting element of the present invention has a structure in which a first insulating film 302 is formed of an insulating material over a first electrode 301 made of a conductive material; a plurality of carrier supply layers 303 is partly and separately formed over the first insulating film 302; a light emitting layer 304 is formed over the carrier supply layers 303; a second insulating film 305 is formed of an insulating material over the light emitting layer 304; and a second electrode 306 is formed of a conductive material over the second insulating film 305.

Figure 4A:
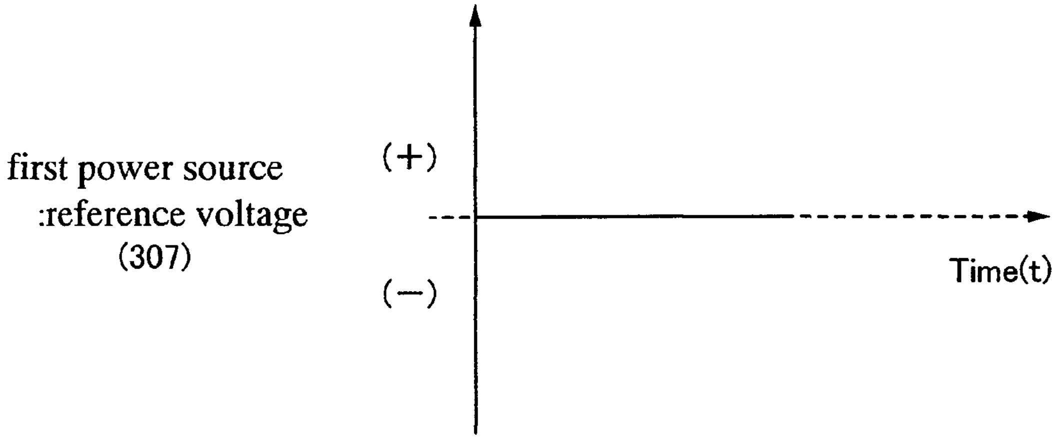
FIGS. 4A and 4B are diagrams each illustrating a light emitting element of the present invention.

Note that the first electrode 301 is electrically connected to a first power source 307, and a constant voltage (reference voltage) is applied from the first power source 307 to the first electrode 301 as shown in FIG. 4A.

Figure 4B:
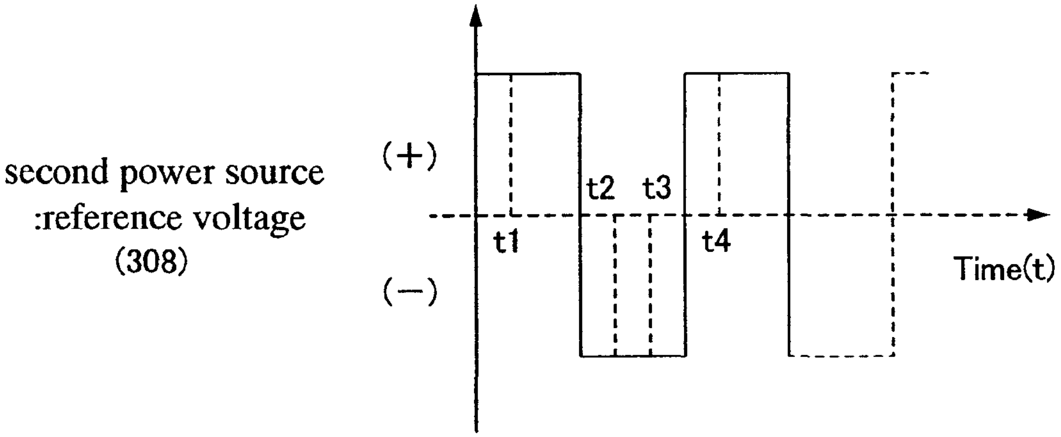

On the other hand, the second electrode 306 is electrically connected to a second power source 308, and voltages having positive and negative polarities with respect to the reference voltage are alternately applied from the second power source 308 to the second electrode 306 as time (t) (the horizontal axis of FIG. 4B) passes, as shown in FIG. 4B.

Note that the above-mentioned voltage having positive polarity refers to a voltage which is higher than the reference voltage applied from the first power source 307 to the first electrode 301, and the voltage having negative polarity refers to a voltage which is lower than the reference voltage applied from the first power source 307 to the first electrode 301.

Next, the states of carriers in the light emitting layer of the light emitting element of the present invention are described with reference to model diagrams of FIGS. 5A to 5D. Note that the same reference numerals are used in FIG. 3 and FIGS. 5A to 5D for convenience of explanation.

Figure 5A:
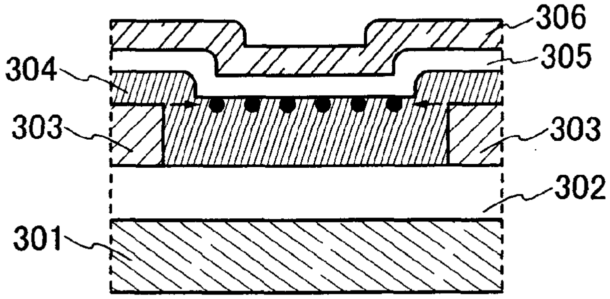
FIGS. 5A to 5D are diagrams illustrating carrier movement in a light emitting element of the present invention.

First, when the voltage having positive polarity is applied to the second electrode 306 (t=t1 in FIG. 4B), carriers are supplied from the carrier supply layers 303 to an upper interface of the light emitting layer 304 with the second insulating film 305 as shown in FIG. 5A.

Figure 5B:
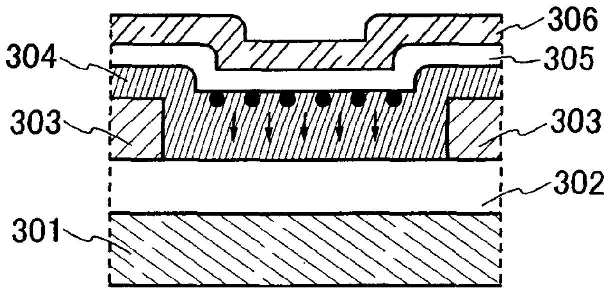
Figure 5C:
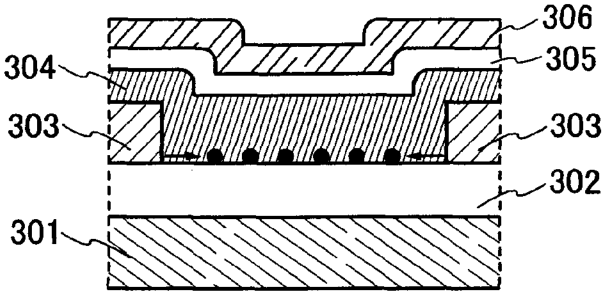

Next, when the voltage having negative polarity is applied to the second electrode 306 (t=t2 in FIG. 4B), the carriers are accelerated, as indicated by arrows in FIG. 5B, by an electric field generated by the voltage having negative polarity which is applied to the second electrode 306, and the carriers collide with atoms of the additive material included in the light emitting layer 304, thereby exciting electrons in the atoms of the additive material. The excited electrons are immediately released to a ground state, and energy at that time is emitted as light.

Further, in a state where the voltage having negative polarity is applied to the second electrode 306 (t=t3 in FIG. 4B), the carriers are supplied from the carrier supply layers 303 to a lower interface of the light emitting layer 304 with the first insulating film 302.

Figure 5D:
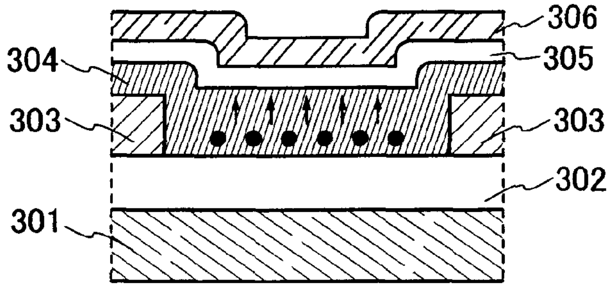

When the voltage having positive polarity is applied to the second electrode 306 again (t=t4 in FIG. 4B), the carriers present near the interface between the light emitting layer 304 and the first insulating film 302 are accelerated by an electric field as indicated by arrows in FIG. 5D, and the carriers collide with atoms of the additive material included in the light emitting layer 304, thereby exciting electrons in the atoms of the additive material.

Thus, alternate application of a voltage having positive polarity and a voltage having negative polarity to the second electrode 306 can cause light emission in the light emitting layer 304 of the light emitting element.

In the light emitting element of this embodiment mode, the efficiency of carrier supply to the light emitting layer can be increased due to the carrier supply layers provided so as to be partly in contact with the light emitting layer, so that drive voltage thereof can be reduced.

Embodiment Mode 3

This embodiment mode describes an active-matrix light emitting device in which each of pixels included in a pixel portion includes a thin film transistor (TFT) and the light emitting element of the present invention.

Figure 6A:
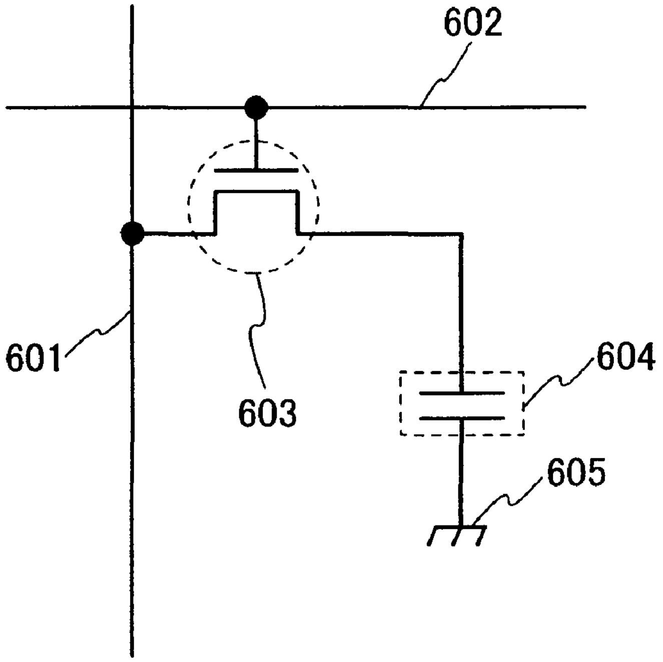
FIGS. 6A and 6B are diagrams illustrating circuit structures of an active-matrix light emitting device of the present invention.
Figure 6B:
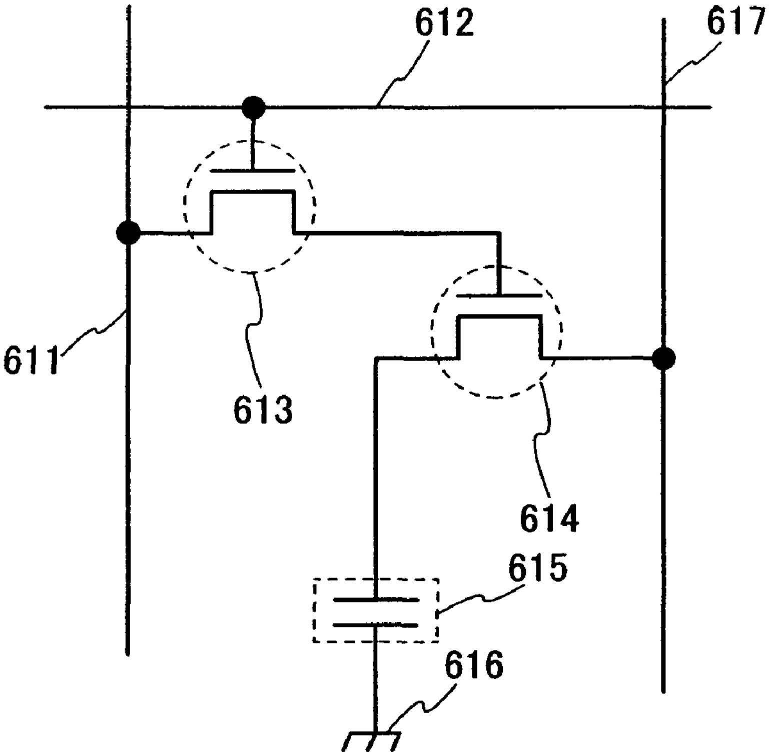

Note that the active-matrix light emitting device can have such a circuit structure as shown in either FIG. 6A or 6B.

FIG. 6A shows a structure in which each pixel includes a single light emitting element and a single TFT functioning as a switch of the light emitting element. Therefore, the TFT shown in FIG. 6A is referred to as a switching TFT (603).

A gate electrode of the switching TFT 603 is connected to a gate line (Gj) 602. One terminal connected to a channel formation region of the switching TFT 603 is electrically connected to a source line (Si) 601, and the other terminal is electrically connected to one electrode of a light emitting element 604. Note that the other electrode of the light emitting element 604 is electrically connected to a counter power source 605 maintaining a constant voltage (reference voltage).

A signal for turning on or off the switching TFT 603 (DC voltage $V_{gate}$) is inputted through the gate line (Gj) 602. A signal for driving the light emitting element 604 (AC voltage $V_{sig}$) is inputted through the source line (Si) 601; here, a voltage higher than the reference voltage (voltage having positive polarity) and a voltage lower than the reference voltage (voltage having negative polarity) are alternately applied periodically.

Note that a gray scale can be expressed by changing the amplitude of $V_{sig}$.

FIG. 6B shows a structure in which each pixel includes a single light emitting element and two TFTs. Note that the TFTs here are of two kinds: a driving TFT 614 functioning to drive a light emitting element 615 and a switching TFT 613 functioning as a switch of the driving TFT 614.

A gate electrode of the switching TFT 613 is connected to a gate line (Gj) 612. One terminal connected to a channel formation region of the switching TFT 613 is electrically connected to a source line (Si) 611, and the other terminal is electrically connected to a gate electrode of the driving TFT 614.

One terminal connected to a channel formation region of the driving TFT 614 is electrically connected to a current supply line (Vi) 617, and the other terminal is electrically connected to one electrode of the light emitting element 615. Note that the other electrode of the light emitting element 615 is electrically connected to a counter power source 616 maintaining a constant voltage (reference voltage).

A signal for turning on or off the switching TFT 613 (DC voltage $V_{gate}$) is inputted through the gate line (Gj) 612, and a signal for turning on or off the driving TFT 614 (DC voltage $V_{sig}$) is inputted through the source line (Si) 611. An alternating voltage for driving the light emitting element 615 is inputted through the current supply line (Vi) 617; here, a voltage higher than the reference voltage (voltage having positive polarity) and a voltage lower than the reference voltage (voltage having negative polarity) are alternately applied periodically.

Note that a gray scale can be expressed by changing the amplitude of $V_{sig}$.

Next, a detailed structure of a pixel portion of an active-matrix light emitting device having the circuit structure shown in FIG. 6B is described with reference to FIGS. 7A and 7B. Note that FIG. 7A is a top view showing a driving portion of a pixel, and FIG. 7B shows a cross-sectional view taken along a line A-A' in FIG. 7A.

Figure 7A:
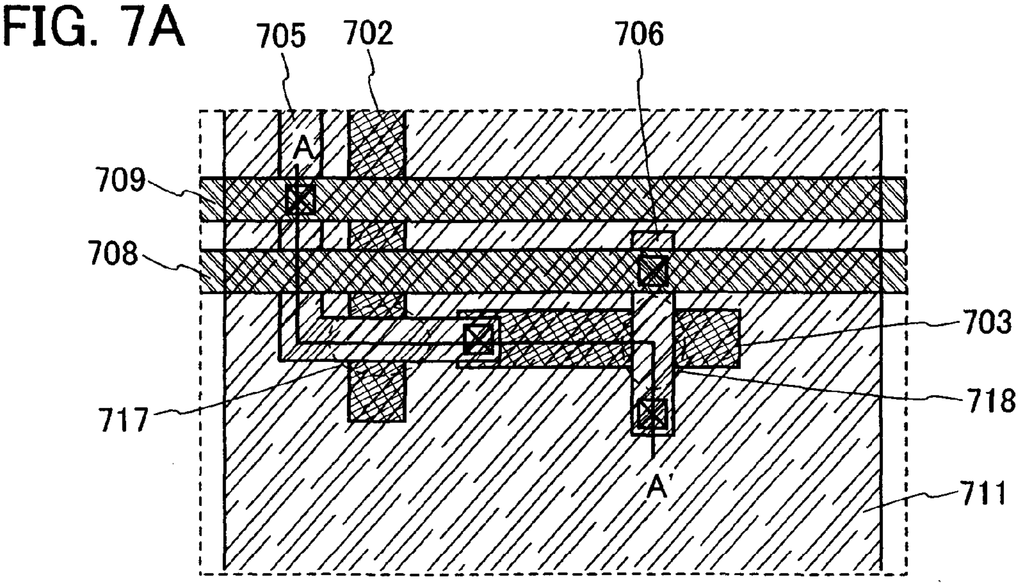
FIGS. 7A and 7B are diagrams illustrating a pixel portion of an active-matrix light emitting device of the present invention.

FIG. 7A shows a driving portion of a pixel, which includes a gate line 702, a source line 709, and a current supply line 708. Note that each pixel includes two TFTs, a switching TFT 717 and a driving TFT 718. A part of the gate line 702 serves as a gate electrode of the switching TFT 717, and a part of a semiconductor film 705 which also functions as a channel formation region of the switching TFT 717 is electrically connected to the source line 709.

Another part of the semiconductor film 705 which also functions as the channel formation region of the switching TFT 717 is electrically connected to a gate electrode 703 of the driving TFT 718. Note that a part of a semiconductor film 706 which also functions as a channel formation region of the driving TFT 718 is electrically connected to the current supply line 708, and another part of the semiconductor film 706 is electrically connected to one electrode (here, referred to as a first electrode 711) of a light emitting element, which functions as a pixel electrode.

Figure 7B:
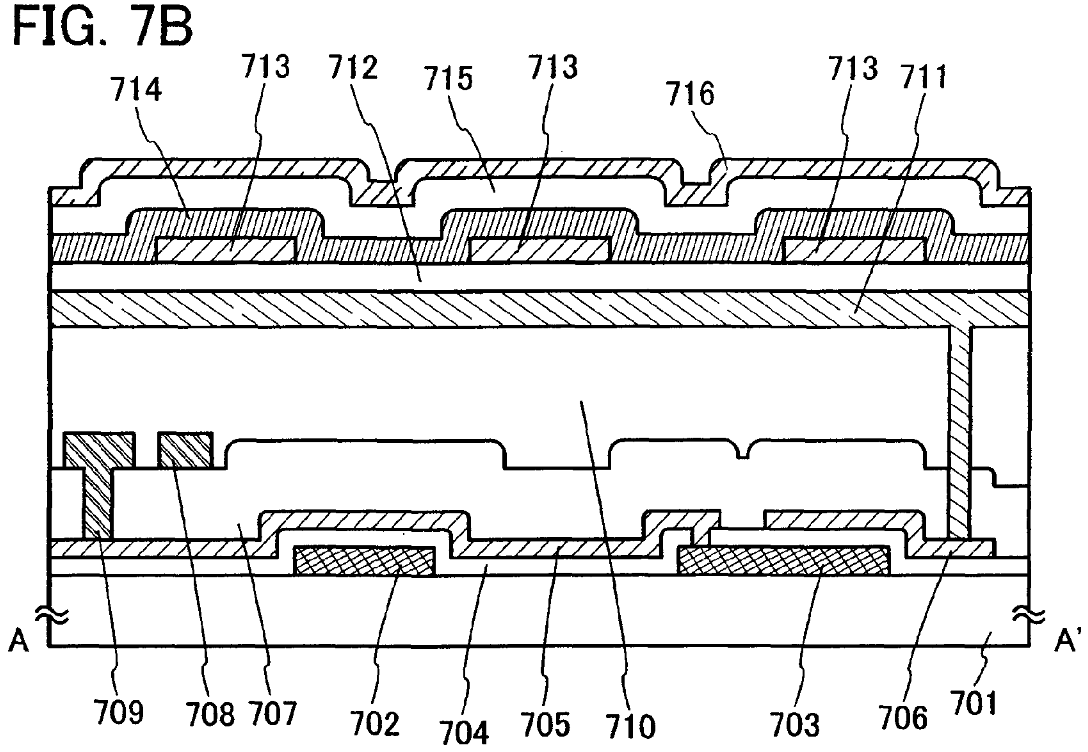

Next, the cross-sectional structure shown in FIG. 7B is described. The gate electrodes 702 and 703 are formed over a substrate 701 by patterning a conductive film made of a conductive material. Note that the gate electrode 702 is a part of the gate line.

A first insulating film 704 is formed of an insulating material over the gate electrodes 702 and 703, respective parts of which function as gate insulating films of the switching TFT 717 and the driving TFT 718.

The semiconductor films 705 and 706 are formed over the first insulating film 704. Note that an inorganic semiconductor material which includes as its main component silicon, silicon germanium (SiGe), gallium arsenide (GaAs), zinc oxide (ZnO), or the like can be used for the semiconductor films 705 and 706. Alternatively, an organic semiconductor material which includes pentacene, oligothiophene, or the like as its main component can be used for the semiconductor films 705 and 706.

Note that the semiconductor films 705 and 706 are patterned into a desired shape as shown in FIGS. 7A and 7B and are electrically connected to other wirings, electrodes, and the like.

A second insulating film 707 is formed of an insulating material over the semiconductor films 705 and 706. Note that the second insulating film 707 functions as a so-called first interlayer insulating film.

A wiring is formed over the second insulating film 707 by patterning a conductive film made of a conductive material. Note that a wiring 709 functioning as the source line is formed to be electrically connected to the semiconductor film 705 previously formed, and although not shown in FIG. 7B, a wiring 708 functioning as the current supply line is formed to be electrically connected to one terminal of the driving TFT.

A third insulating film 710 is formed of an insulating material over these wirings 708 and 709. Note that the third insulating film 710 functions as a so-called second interlayer insulating film.

The first electrode 711 functioning as one electrode of the light emitting element is formed over the third insulating film 710. Note that the first electrode 711 is electrically connected to the semiconductor film 706 with the second insulating film 707 and the third insulating film 710 interposed therebetween, and is patterned into a desired shape so as to serve as the pixel electrode that constitutes a part of one pixel.

A fourth insulating film 712 is formed of an insulating material over the first electrode 711. Note that the fourth insulating film 712 functions as one of insulating films that constitute a part of a double insulating structure in the light emitting element.

A carrier supply layer 713 is formed over the fourth insulating film 712. Note that the carrier supply layer 713 can be formed using a material similar to that described in Embodiment Mode 1.

A light emitting layer 714 is formed over the carrier supply layer 713. Note that the light emitting layer 714 can be formed using the base material and the additive material described in Embodiment Mode 1.

A fifth insulating film 715 is formed of an insulating material over the light emitting layer 714. Note that the fifth insulating film 715 functions as the other of the insulating films that constitute a part of the double insulating structure in the light emitting element.

A second electrode 716 functioning as the other electrode of the light emitting element is formed over the fifth insulating film 715.

As described above, in the active-matrix light emitting device described in this embodiment mode, the efficiency of carrier supply to the light emitting layer can be increased due to the carrier supply layer provided so as to be partly in contact with the light emitting layer, so that drive voltage thereof can be reduced.

Embodiment Mode 4

This embodiment mode describes a method for manufacturing an active-matrix light emitting device in which each of pixels included in a pixel portion includes two thin film transistors (TFTs) and the light emitting element of the present invention.

Figure 8A:
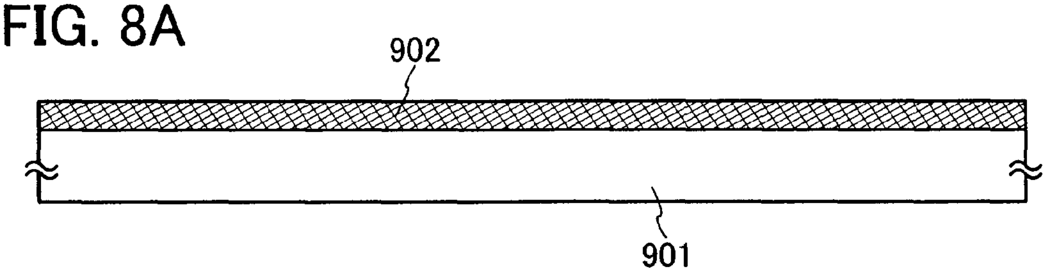
FIGS. 8A to 8E are diagrams illustrating a method for manufacturing an active-matrix light emitting device of the present invention.

As shown in FIG. 8A, a first conductive film 902 is formed over a substrate 901. The first conductive film 902 is formed by a film formation method such as a sputtering method, a PVD method, a CVD method, a droplet discharge method, an ink-jet method, or a printing method, using a conductive film including a semiconductor such as Si or Ge; a single-layer conductive film of a metal element such as Ag, Au, Cu, Ni, Pt, Pd, Ir, Rh, W, Al, Ta, Mo, Cd, Zn, Fe, Ti, Zr, Ba, or Nd; a stacked conductive film of a combination of a plurality of the above metal elements; a conductive film made of an alloy which includes the metal element as its main component (such as an aluminum-titanium alloy film); a conductive film made of a metal nitride using the metal element; or the like. Alternatively, it may be formed using a conductive film of indium tin oxide (ITO), indium zinc oxide (IZO) formed using a target in which indium oxide containing silicon oxide is mixed with zinc oxide (ZnO) of 2 wt % to 20 wt %, indium tin oxide containing silicon oxide as a component (ITSO), or the like.

Note that the conductive film in this specification refers to a film with a resistivity of $1\times10^{-3}$ Ωcm or less.

The thickness of the first conductive film 902 is preferably 50 nm to 500 nm, more preferably 150 nm to 300 nm.

The substrate 901 can be any of the following: a glass substrate, a quartz substrate, a substrate formed of an insulating substance like ceramic such as alumina, a plastic substrate, a silicon wafer, a metal plate, paper, and the like.

Figure 8B:
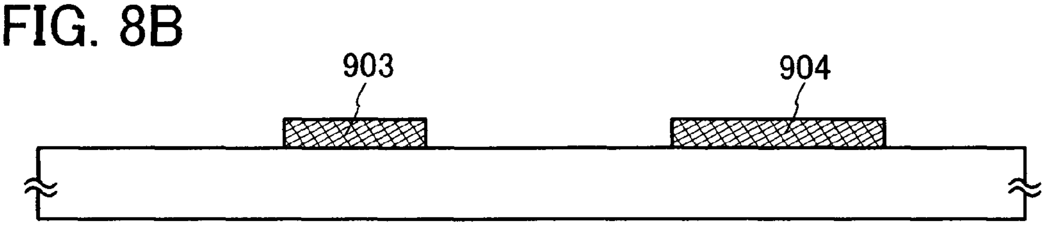

Next, gate electrodes 903 and 904 are formed by patterning the first conductive film 902 (FIG. 8B). When the first conductive film 902 is formed using a film formation method such as a sputtering method or a CVD method, a mask is formed over the conductive film by a droplet discharge method, a photolithography step, light exposure and development of a photosensitive material using a laser-beam direct drawing apparatus, or the like, and the conductive film is patterned into a desired shape using the mask.

Next, a first insulating film 905 is formed. The first insulating film 905 can be formed by a film formation method such as a CVD method or a sputtering method, using a single-layer film of an insulating film containing silicon such as a silicon oxide (for example, $SiO_2$) film, a silicon nitride (for example, $Si_3N_4$) film, a silicon oxynitride film, or a silicon nitride oxide film or an insulating film of metal oxide (for example, $Al_2O_3$ or $BaTiO_3$) or the like, or a stacked film formed by stacking the single-layer films. Note that since the first insulating film 905 functions as a gate insulating film, the thickness thereof is preferably 50 nm to 200 nm, more preferably 100 nm to 150 nm.

Figure 8C:
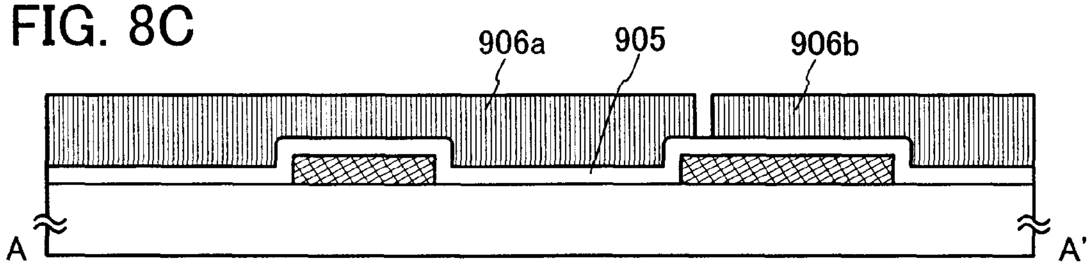

Next, as shown in FIG. 8C, first masks 906*a* and 906*b* are formed in a desired position over the first insulating film 905 by, for example, a droplet discharge method, a photolithography step, light exposure and development of a photosensitive material using a laser-beam direct drawing apparatus, or the like. Then, an opening is formed in a part of the first insulating film 905 so as to reach the gate electrode 904.

After the first masks 906*a* and 906*b* are removed, a first semiconductor film 907 is formed over the first insulating film 905. The first semiconductor film 907 can be formed by a film formation method such as a CVD method or a sputtering method, using an inorganic semiconductor material such as silicon, silicon germanium (SiGe), gallium arsenide (GaAs), zinc oxide (ZnO), or the like or an organic semiconductor material such as pentacene or oligothiophene.

Note that the first semiconductor film 907 may include an acceptor element or a donor element such as phosphorus, arsenic, or boron in addition to the above-mentioned main component. The thickness of the first semiconductor film 907 is 40 nm to 250 nm, preferably 50 nm to 150 nm.

Figure 8D:
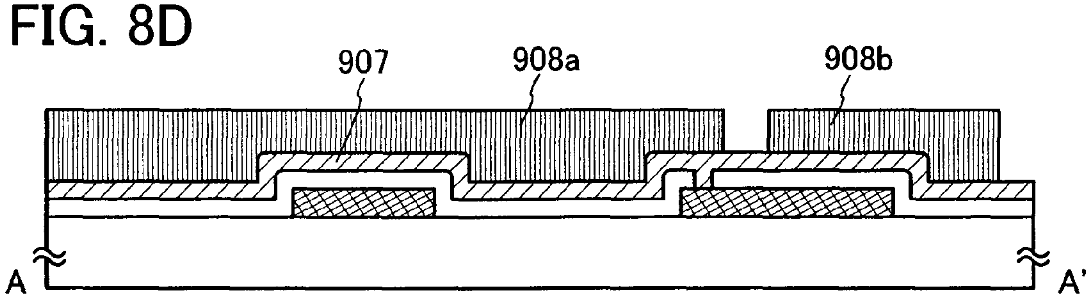
Figure 8E:
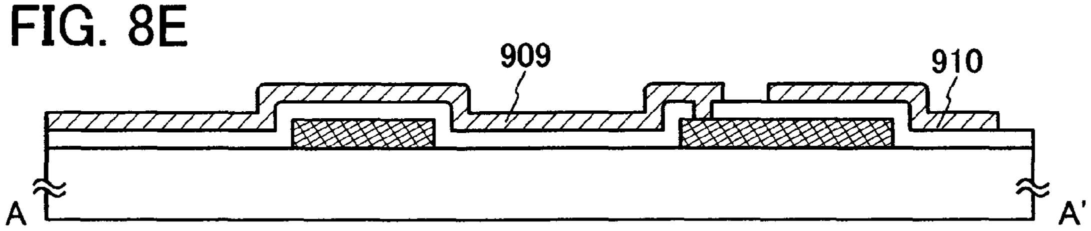

Next, as shown in FIG. 8D, second masks 908*a* and 908*b* are formed in a desired position over the first semiconductor film 907, and the first semiconductor film 907 is patterned into a desired shape by etching with the use of the second masks 908*a* and 908*b*, thereby obtaining first semiconductor films 909 and 910 (FIG. 8E).

Next, a second insulating film 911 is formed. Note that the second insulating film 911 is formed by a film formation method such as a plasma CVD method or a sputtering method to have a single-layer or stacked structure using an insulating film such as a silicon oxide film, a silicon nitride film, a silicon nitride oxide film, or a silicon oxynitride film. Note that the thickness of the second insulating film 911 is 300 nm to 800 nm, preferably 400 nm to 600 nm.

Figure 9A:
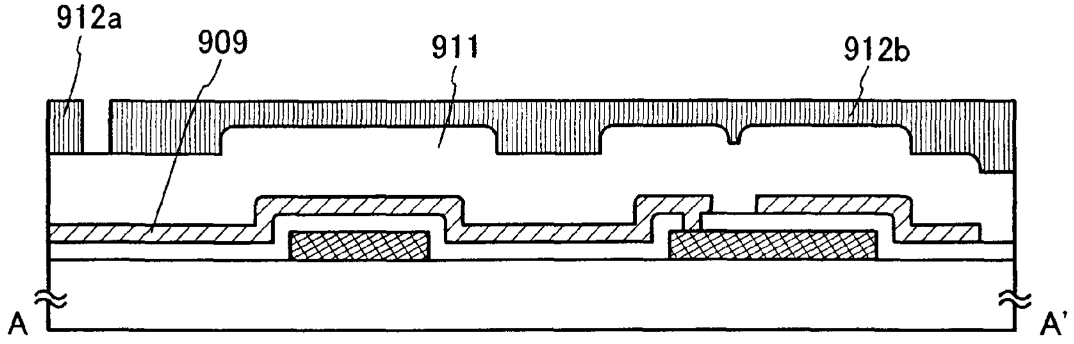
FIGS. 9A to 9C are diagrams illustrating a method for manufacturing an active-matrix light emitting device of the present invention.
Figure 9B:
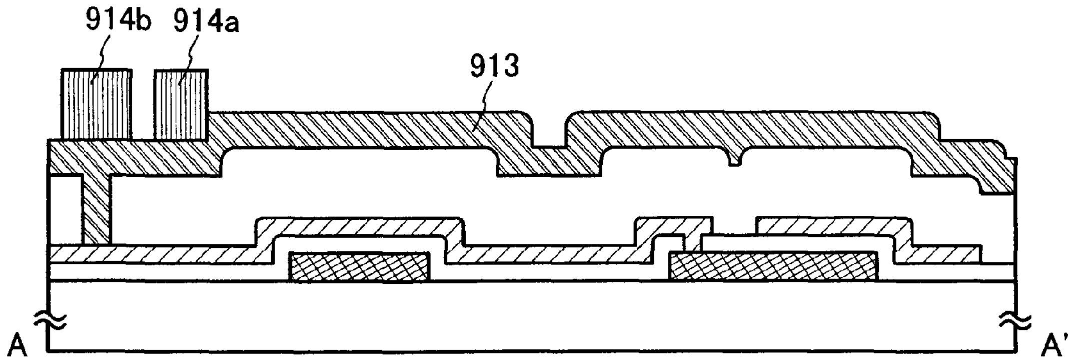

Further, as shown in FIG. 9A, third masks 912*a* and 912*b* are formed in a desired position over the second insulating film 911, and an opening is formed in a part of the second insulating film 911 using the third masks 912*a* and 912*b* so as to reach the first semiconductor film 909. Note that although not shown, another opening is also formed at this time so as to reach the first semiconductor film 910.

After the third masks 912*a* and 912*b* are removed, a second conductive film 913 is formed over the second insulating film 911. The second conductive film 913 can be formed using a film formation method such as a sputtering method, a PVD method, a CVD method, a droplet discharge method, an ink-jet method, or a printing method. Note that the thickness of the second conductive film 913 is preferably 100 nm to 700 nm, more preferably 150 nm to 300 nm.

The second conductive film 913 can be formed using a conductive film including a semiconductor such as Si or Ge; a single-layer conductive film of a metal element such as Ag, Au, Cu, Ni, Pt, Pd, Ir, Rh, W, Al, Ta, Mo, Cd, Zn, Fe, Ti, Zr, Ba, or Nd; a stacked conductive film of a combination of a plurality of the above metal elements; a conductive film made of an alloy which includes the metal element as its main component (such as an aluminum-titanium alloy film); a conductive film made of metal nitride using the metal element; or the like. Alternatively, it may be formed using a conductive film of indium tin oxide (ITO), indium zinc oxide (IZO) formed using a target in which indium oxide containing silicon oxide is mixed with zinc oxide (ZnO) of 2 wt % to 20 wt %, indium tin oxide containing silicon oxide as a component (ITSO), or the like. Note that the above metal element in paste form may be used when using an ink-jet method.

Figure 9C:
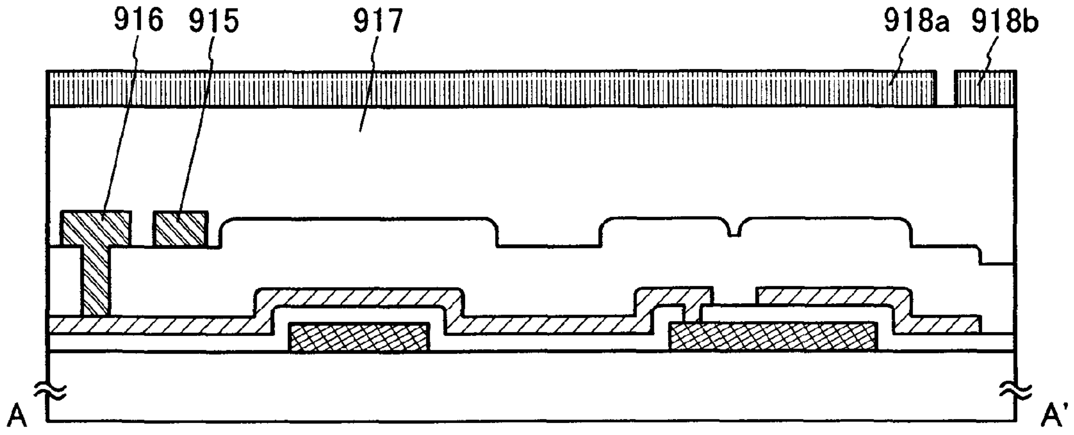

Fourth masks 914*a* and 914*b* are formed over the second conductive film 913, and a part of the second conductive film 913 is etched to form a desired shape. Of second conductive films 915 and 916 which are formed by patterning at this time, the second conductive film 915 functions as a current supply line and the second conductive film 916 functions as a source line. The second conductive film 916 is electrically connected to the first semiconductor film 909 as shown in FIG. 9C. Note that the second conductive film 915 is also electrically connected to the first semiconductor film 910 through the opening previously formed although not shown.

Next, a third insulating film 917 is formed. The third insulating film 917 is formed by a film formation method such as a CVD method or a sputtering method to have a single-layer or stacked structure using an insulating film such as a silicon oxide film, a silicon nitride film, a silicon nitride oxide film, or a silicon oxynitride film. The thickness of the third insulating film 917 is 800 nm to 2000 nm, preferably 1000 nm to 1500 nm.

Further, as shown in FIG. 9C, fifth masks 918*a* and 918*b* are formed in a desired position over the third insulating film 917, and an opening is formed in a part of the third insulating film 917 using the fifth masks 918*a* and 918*b* so as to reach the first semiconductor film 910.

After the fifth masks 918*a* and 918*b* are removed, a third conductive film 919 is formed over the third insulating film 917. The third conductive film 919 can be formed using a film formation method such as a sputtering method, a PVD method, a CVD method, a droplet discharge method, an ink-jet method, or a printing method. Note that the thickness of the third conductive film 919 is preferably 50 nm to 400 nm, more preferably 100 nm to 250 nm.

The third conductive film 919 can be formed using a conductive film including a semiconductor such as Si or Ge; a single-layer conductive film of a metal element such as Ag, Au, Cu, Ni, Pt, Pd, Ir, Rh, W, Al, Ta, Mo, Cd, Zn, Fe, Ti, Zr, Ba, or Nd; a stacked conductive film of a combination of a plurality of the above metal elements; a conductive film made of an alloy which includes the metal element as its main component (such as an aluminum-titanium alloy film); a conductive film made of metal nitride using the metal element; or the like. Alternatively, it may be formed using a conductive film of indium tin oxide (ITO), indium zinc oxide (IZO) formed using a target in which indium oxide containing silicon oxide is mixed with zinc oxide (ZnO) of 2 wt % to 20 wt %, indium tin oxide containing silicon oxide as a component (ITSO), or the like. Note that the above metal element in paste form may be used when using an ink-jet method.

The third conductive film 919 functions as one electrode of the light emitting element. Therefore, when it is required to have a function as an electrode through which light obtained in the light emitting layer of the light emitting element is extracted, a material with high transmittance (for example, 40% or higher) with respect to visible light is preferably selected from the above materials to form the third conductive film 919. When the third conductive film 919 is formed as an electrode through which light does not need to be extracted, a material with low transmittance (for example, lower than 10%) with respect to visible light or a material with high reflectance (for example, 40% or higher) is preferably selected from the above materials to form the third conductive film 919.

A sixth mask (not shown) is formed over the third conductive film 919, and a part of the third conductive film 919 is etched to form a desired shape. The third conductive film 919 patterned here is one electrode of the light emitting element and functions as a pixel electrode. Note that the third conductive film 919 is electrically connected to the first semiconductor film 910 previously formed (FIG. 10A).

Figure 10A:
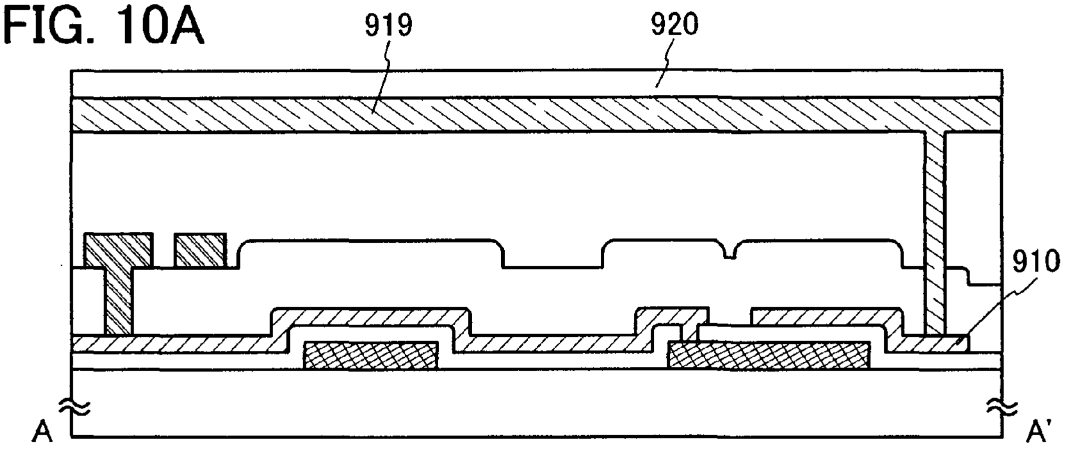
FIGS. 10A to 10C are diagrams illustrating a method for manufacturing an active-matrix light emitting device of the present invention.

After the sixth mask (not shown) is removed, a fourth insulating film 920 which functions as one of insulating films of the light emitting element is formed over the patterned third conductive film 919 (FIG. 10A). Note that the fourth insulating film 920 is formed by a film formation method such as a CVD method or a sputtering method to have a single-layer or stacked structure using an insulating film containing silicon such as a silicon oxide (for example, $SiO_2$) film, a silicon nitride (for example, $Si_3N_4$) film, a silicon nitride oxide film, or a silicon oxynitride film, or an insulating film of metal oxide (for example, $Al_2O_3$ or $BaTiO_3$) or the like. Note that the thickness of the fourth insulating film 920 is 50 nm to 250 nm, preferably 100 nm to 200 nm.

Next, a second semiconductor film 921 is formed over the fourth insulating film 920. Note that the second semiconductor film 921 includes an impurity which imparts n-type or p-type conductivity to the second semiconductor film.

The second semiconductor film 921 can be formed by a film formation method such as a CVD method or a sputtering method. Note that the thickness of the second semiconductor film 921 is 50 nm to 300 nm, preferably 100 nm to 200 nm.

The second semiconductor film 921 can be formed using a semiconductor material such as zinc sulfide (ZnS), gallium nitride (GaN), or zinc oxide (ZnO), another known semiconductor material, or the like which includes indium (In), aluminum (Al), gallium (Ga), silicon (Si), or the like as an n-type impurity element or nitrogen (N), phosphorus (P), zinc (Zn), or the like as a p-type impurity element.

Note that specific examples of the material used for the second semiconductor film 921 are as follows: n-type ZnS to which In or the like is added, n-type ZnO to which Al or Ga is added, n-type GaN to which Si is added, p-type ZnO to which N or P is added, p-type GaN to which Zn is added, and the like.

Figure 10B:
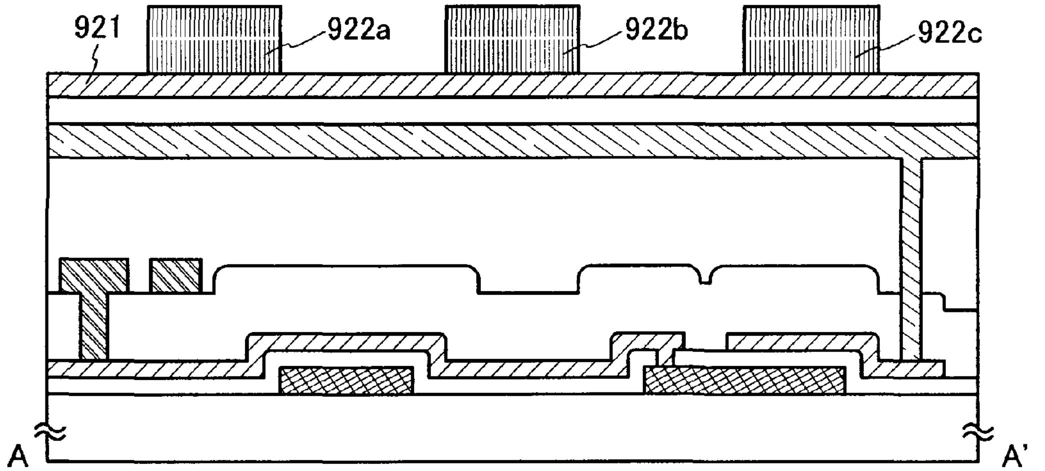

Seventh masks 922*a*, 922*b*, and 922*c* are formed over the second semiconductor film 921 as shown in FIG. 10B, and a part of the second semiconductor film 921 is etched to form a desired shape. Second semiconductor films 923*a*, 923*b*, and 923*c* which are formed by patterning here function as carrier supply layers.

After the seventh masks 922*a*, 922*b*, and 922*c* are removed, a light emitting layer 924 is formed over the second semiconductor film 923*a*, 923*b*, and 923*c* formed by patterning. Note that the light emitting layer 924 includes a base material that is a semiconductor and an additive material that is a light emitting center.

The base material can be any of the following materials: a compound including a Group 2 element and a Group 16 element of the periodic table (hereinafter referred to as a Group 2-Group 16 compound), a compound including a Group 12 element and a Group 16 element (hereinafter referred to as a Group 12-Group 16 compound), a compound including a Group 13 element and a Group 15 element (hereinafter referred to as a Group 13-Group 15 compound), a compound including a Group 2 (or Group 12 or rare-earth) element, a Group 13 element, and a Group 16 element (hereinafter referred to as a Group 2-Group 13-Group 16 compound), a compound including a plurality of Group 14 elements (hereinafter referred to as a Group 14 compound), a compound including a rare-earth element and sulfur (S) (hereinafter referred to as rare-earth sulfide), a combination thereof, and the like.

Examples of the Group 2-Group 16 compound are as follows: calcium sulfide (CaS), strontium sulfide (SrS), barium sulfide (BaS), and the like. Examples of the Group 12-Group 16 compound are as follows: zinc sulfide (ZnS), cadmium sulfide (CdS), zinc oxide (ZnO), and the like; the Group 13-Group 15 compound, gallium nitride (GaN) and the like; the Group 2-Group 13-Group 16 compound, strontium gallium sulfide ($SrGa_2S_4$), magnesium zinc oxide ($MgZn_{1-x}O$), and the like; the Group 14 compound, silicon carbide (SiC) and the like; and the rare-earth sulfide, yttrium sulfide ($Y_2S_3$) and the like.

The additive material can be a transition metal, a rare-earth element, or the like. Note that specific examples of the additive material are as follows: cerium (Ce), praseodymium (Pr), samarium (Sm), europium (Eu), terbium (Tb), thulium (Tm), chromium (Cr), iron (Fe), cobalt (Co), nickel (Ni), copper (Cu), silver (Ag), gold (Au), platinum (Pt), manganese (Mn), and the like.

Note that specific examples of a combination of the base material and the additive material (base material:additive material) which is used for the light emitting layer 924 are as follows: zinc sulfide (ZnS) and manganese (Mn) (ZnS:Mn), strontium sulfide (SrS) and cerium (Ce) (SrS:Ce), zinc sulfide (ZnS) and terbium (Tb) (ZnS:Tb), and the like.

The light emitting layer 924 can be formed by a film formation method such as a CVD method or a sputtering method. Note that the thickness of the light emitting layer 924 is 50 nm to 300 nm, preferably 100 nm to 200 nm.

Next, a fifth insulating film 925 which functions as the other insulating film of the light emitting element is formed over the light emitting layer 924. Note that the fifth insulating film 925 is formed by a film formation method such as a plasma CVD method or a sputtering method to have a single-layer or stacked structure using an insulating film containing silicon such as a silicon oxide (for example, $SiO_2$) film, a silicon nitride (for example, $Si_3N_4$) film, a silicon nitride oxide film, or a silicon oxynitride film, or an insulating film of metal oxide (for example, $Al_2O_3$ or $BaTiO_3$) or the like. Note that the thickness of the fifth insulating film 925 is 50 nm to 250 nm, preferably 100 nm to 200 nm.

Figure 10C:
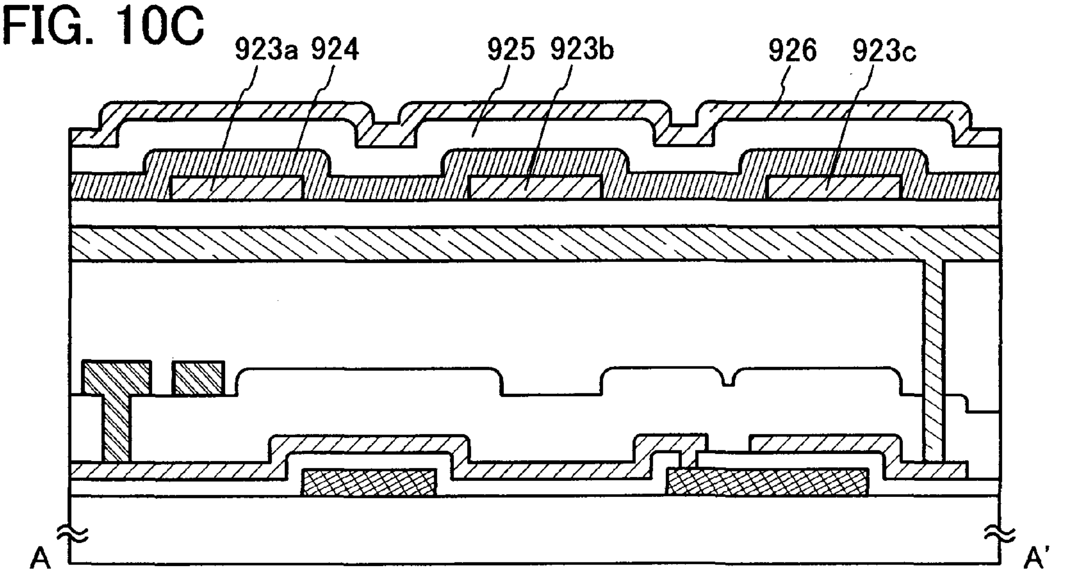

Next, a fourth conductive film 926 is formed over the fifth insulating film 925 (FIG. 10C). The fourth conductive film 926 can be formed using a film formation method such as a sputtering method, a PVD method, a CVD method, a droplet discharge method, an ink-jet method, or a printing method. Note that the thickness of the fourth conductive film 926 is preferably 50 nm to 400 nm, more preferably 100 nm to 250 nm.

The fourth conductive film 926 can be formed using a conductive film including a semiconductor such as Si or Ge; a single-layer conductive film of a metal element such as Ag, Au, Cu, Ni, Pt, Pd, Ir, Rh, W, Al, Ta, Mo, Cd, Zn, Fe, Ti, Zr, Ba, or Nd; a stacked conductive film of a combination of a plurality of the above metal elements; a conductive film made of an alloy which includes the metal element as its main component (such as an aluminum-titanium alloy film); a conductive film made of metal nitride using the metal element; or the like. Alternatively, it may be formed using a conductive film of indium tin oxide (ITO), indium zinc oxide (IZO) formed using a target in which indium oxide containing silicon oxide is mixed with zinc oxide (ZnO) of 2 wt % to 20 wt %, indium tin oxide containing silicon oxide as a component (ITSO), or the like. Note that the above metal element in paste form may be used when using an ink-jet method.

The above-described third conductive film 919 serves as one electrode of the light emitting element. On the other hand, the fourth conductive film 926 serves also as the other electrode of the light emitting element. Therefore, when the fourth conductive film 926 is required to have a function as an electrode through which light obtained in the light emitting layer of the light emitting element is extracted, a material with high transmittance (for example, 40% or higher) with respect to visible light is preferably selected from the above materials to form the fourth conductive film 926. When the fourth conductive film 926 is formed as an electrode through which light does not need to be extracted, a material with low transmittance (for example, lower than 10%) with respect to visible light or a material with high reflectance (for example, 40% or higher) is preferably selected from the above materials to form the fourth conductive film 926.

In the present invention, unlike in the case described above with reference to FIG. 10B, it is possible as shown in FIG.

11A that a second semiconductor film 928 is formed in advance using a material for forming a light emitting layer; seventh masks 929*a*, 929*b*, and 929*c* are formed over the second semiconductor film 928; and second semiconductor films 931*a*, 931*b*, and 931*c* which function as carrier supply layers can be formed by adding an n-type or p-type impurity element to parts of the second semiconductor film 928 with the seventh masks 929*a*, 929*b*, and 929*c* present. Therefore, regions to which the n-type or p-type impurity element is not added function as light emitting layers 930*a*, 930*b*, and 930*c*.

Note that in the case of employing the manufacturing method shown in FIGS. 11A and 11B, the second semiconductor film 928 needs to be formed using the same material as that of the light emitting layer 924 described with reference to FIG. 10C (the material including the base material that is a semiconductor and the additive material that is a light emitting center). Note that since specific examples of the material used to form the light emitting layer 924 are given above in this embodiment mode, the explanation is omitted here.

Figure 11A:
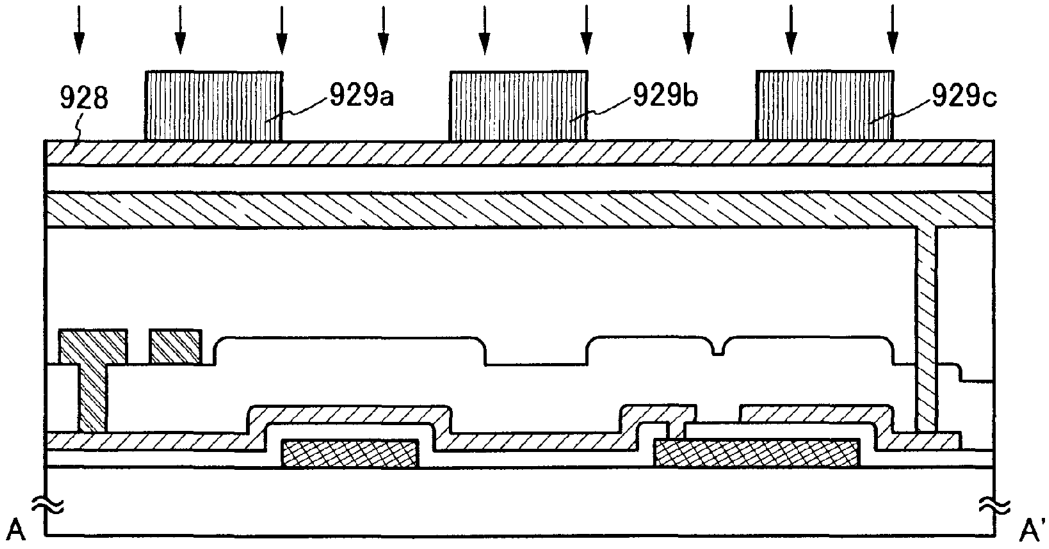
FIGS. 11A and 11B are diagrams illustrating a method for manufacturing an active-matrix light emitting device of the present invention.
Figure 11B:
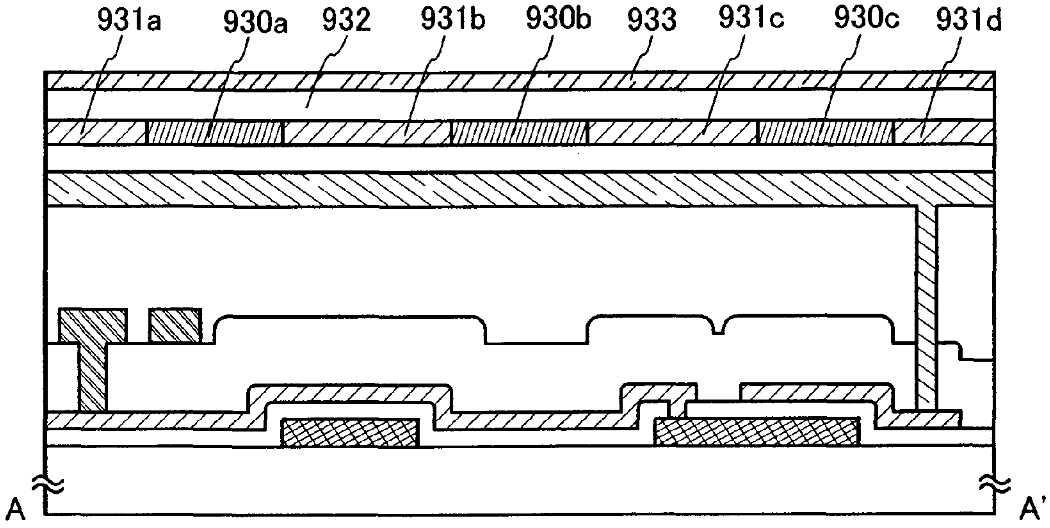

The specific material mentioned above as the impurity element which imparts n-type or p-type conductivity to the second semiconductor film 921 with reference to FIG. 10B can be used as the n-type or p-type impurity element added to the parts of the second semiconductor film 928 in FIG. 11A. Note that specific examples of these impurity elements are also given above in this embodiment mode; therefore, the explanation is omitted here.

A fifth insulating film 932 and a fourth conductive film 933 are sequentially stacked over the second semiconductor films 930*a*, 930*b*, and 930*c* functioning as the light emitting layers and the second semiconductor films 931*a*, 931*b*, and 931*c* functioning as the carrier supply layers. Note that the fifth insulating film 932 formed here can be formed by a similar method and using a similar material to those of the fifth insulating film 925 described with reference to FIG. 10C. The fourth conductive film 933 can be formed by a similar method and using a similar material to those of the fourth conductive film 926 described with reference to FIG. 10C. Therefore, refer to the above description, and the explanation is omitted here.

As described above, the light emitting device described in this embodiment mode includes the light emitting element of the present invention, and in the light emitting element of the present invention, the efficiency of carrier supply to the light emitting layer can be increased. Therefore, the light emitting device has features of not only low drive voltage but also high resistance to deterioration. Accordingly, a light emitting device which consumes less power and has higher reliability than a conventional one can be obtained.

Embodiment Mode 5

Figure 12A:
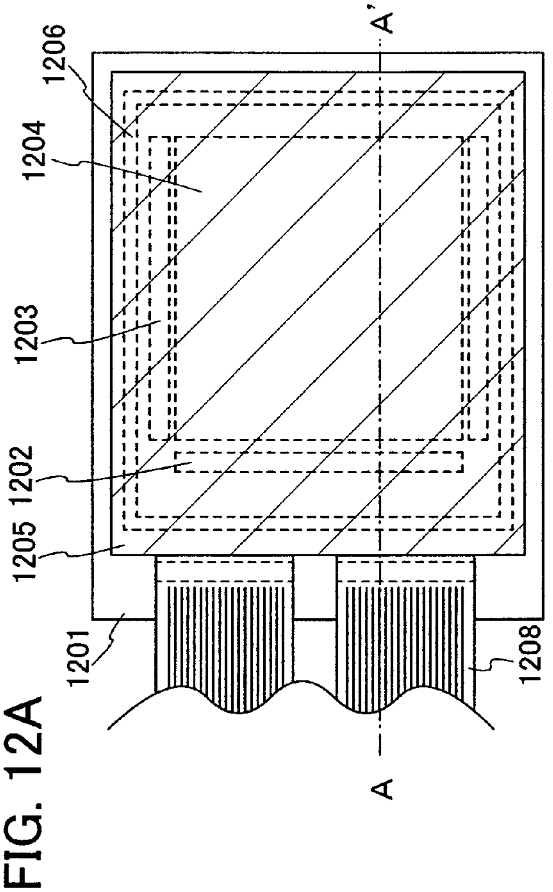
FIGS. 12A and 12B are diagrams illustrating an active-matrix light emitting device of the present invention.
Figure 12B:
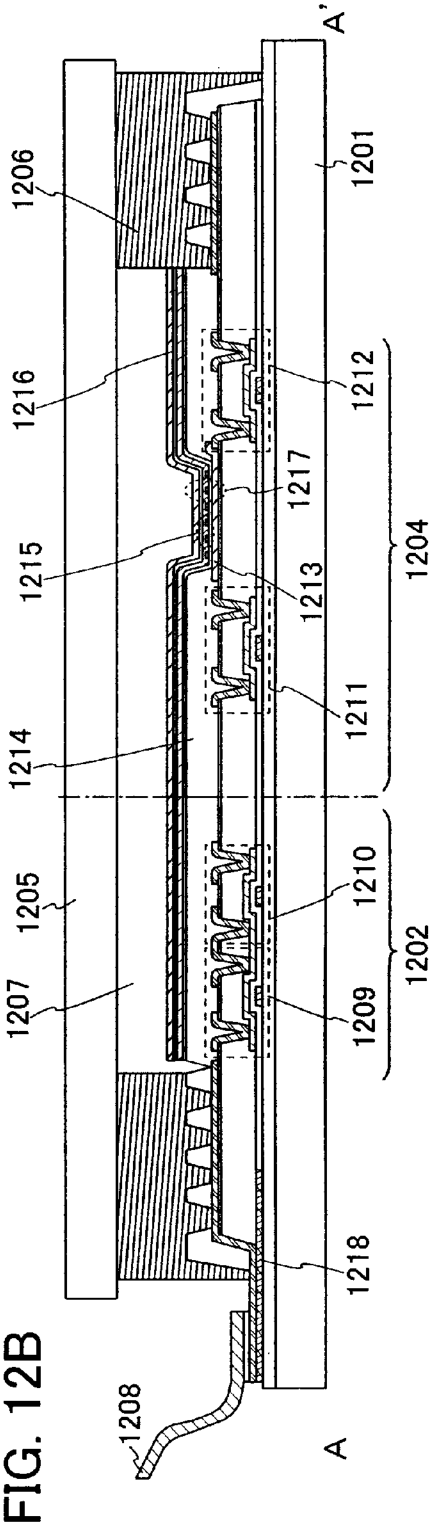

This embodiment mode describes an active-matrix light emitting device which includes the light emitting element formed according to the present invention in a pixel portion, with reference to FIGS. 12A and 12B. Note that the light emitting device of the present invention includes, as a component, the light emitting element of the present invention and a controller of a driver circuit which drives the light emitting element, or the like.

Note that FIG. 12A is a top view showing the light emitting device and FIG. 12B is a cross-sectional view of FIG. 12A taken along a line A-A'.

As shown in FIG. 12A, there are a driver circuit portion (source side driver circuit) 1202, a driver circuit portion (gate side driver circuit) 1203, and a pixel portion 1204 over an element substrate 1201. A reference numeral 1205 denotes a sealing substrate; 1206, a sealant; and 1207, a space surrounded by the sealant 1206.

Note that a lead wiring 1218 (FIG. 12B) is a wiring for transmitting signals to be inputted to the source side driver circuit 1202 and the gate side driver circuit 1203 and receives a video signal, a clock signal, a start signal, a reset signal, and the like from an FPC (Flexible Printed Circuit) 1208 that serves as an external input terminal. Note that only the FPC is shown here; however, the FPC may be provided with a printed wiring board (PWB). The light emitting device in this specification includes not only a main body of the light emitting device but also the light emitting device with an FPC or a PWB attached.

Next, a cross-sectional structure is described with reference to FIG. 12B. The driver circuit portions and the pixel portion are formed over the element substrate 1201. Here, the source side driver circuit 1202 that is the driver circuit portion and the pixel portion 1204 are shown.

Note that a CMOS circuit that is a combination of an n-channel TFT 1209 and a p-channel TFT 1210 is formed as the source side driver circuit 1202. The driver circuit may be a CMOS circuit, a PMOS circuit, or an NMOS circuit. A driver integration type in which a driver circuit is formed over a substrate is described in this embodiment mode, but it is not necessarily required and a driver circuit can also be formed not over a substrate but outside a substrate.

The pixel portion 1204 includes a plurality of pixels, each of which includes a switching TFT 1211, a driving TFT 1212, and a first electrode 1213 which is electrically connected to a drain of the driving TFT 1212. Note that an insulator 1214 is formed to cover an end portion of the first electrode 1213.

A layer 1215 in which a light emitting layer and a carrier supply layer are interposed between two insulating films, and a second electrode 1216 are formed over the first electrode 1213.

The light emitting layer included in the layer 1215 can be formed by a CVD method, a PVD method, a sputtering method, an evaporation method, an ink-jet method, or the like. The light emitting layer and the carrier supply layer can be formed using the materials which are described in Embodiment Mode 1.

In other words, the active-matrix light emitting device in this embodiment mode has a structure as described in Embodiment Mode 1, that is, a structure having a light emitting element 1217 including the layer 1215 in which the light emitting layer and the carrier supply layer are interposed between insulating films, between the first electrode 1213 and the second electrode 1216.

Although FIG. 12B shows only one pixel, a plurality of pixels is formed in matrix in the pixel portion 1204. Note that the active-matrix light emitting device may have a structure in which different materials are appropriately used for light emitting layers so that pixels show light emission of different colors (for example, red (R), green (G), and blue (B)), or a structure combined with a color conversion layer or a color filter.

By attachment of the sealing substrate 1205 to the element substrate 1201 with the sealant 1206, the light emitting element 1217 is provided in the space 1207 surrounded by the element substrate 1201, the sealing substrate 1205, and the sealant 1206. Note that the space 1207 may be filled with an inert gas (such as nitrogen or argon) or the sealant 1206.

As the sealing substrate 1205, a plastic substrate formed of FRP (Fiberglass-Reinforced Plastics), PVF (polyvinyl fluoride), Mylar, polyester, acrylic, or the like can be used besides a glass substrate or a quartz substrate.

As described above, the light emitting device includes the light emitting element of the present invention, and in the light emitting element of the present invention, the efficiency of carrier supply to the light emitting layer can be increased. Therefore, the light emitting device has features of not only low drive voltage but also high resistance to deterioration. Accordingly, a light emitting device which consumes less power and has higher reliability than a conventional one can be obtained.

Note that the light emitting device described in this embodiment mode can be freely combined with any of the structures described in Embodiment Modes 1 to 4.

Embodiment Mode 6

This embodiment mode describes a passive-matrix (simple-matrix) light emitting device which is formed according to the present invention, with reference to FIGS. 13A to 13D.

Figure 13A:
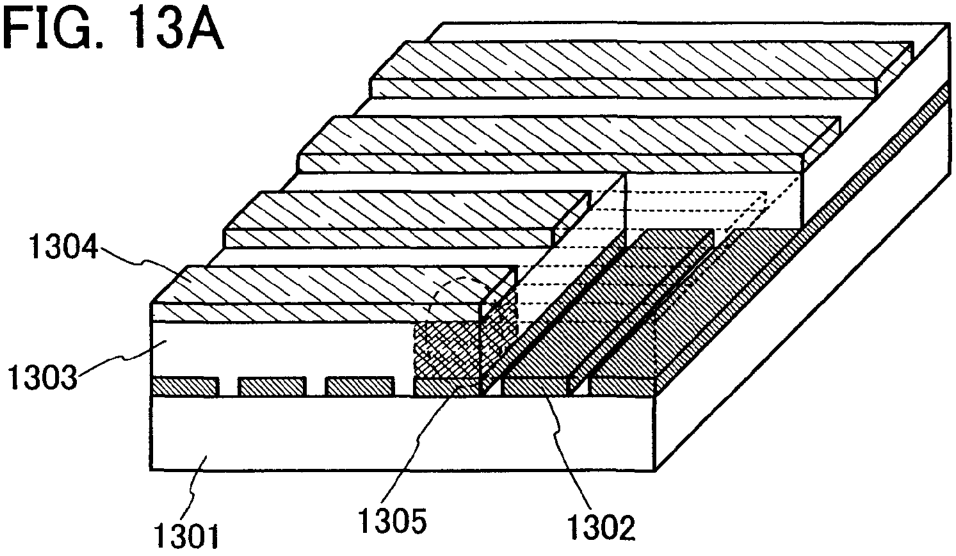
FIGS. 13A to 13D are diagrams illustrating a passive-matrix light emitting device of the present invention.

The passive-matrix light emitting device of the present invention has a structure, as shown in a perspective view of FIG. 13A, in which a plurality of first electrodes 1302 each serving as one electrode of a light emitting element is separately formed in stripes over a first substrate 1301, a layer 1303 in which a light emitting layer and a carrier supply layer are interposed between insulating films is formed over the first electrodes 1302, and a plurality of second electrodes 1304 is separately formed in stripes over the layer 1303 so as to intersect with the first electrodes 1302.

Note that the first electrodes 1302 and the second electrodes 1304 can be formed using a film formation method such as a sputtering method, a PVD method, a CVD method, a droplet discharge method, an ink-jet method, or a printing method. Note that the thickness of each of the first electrodes 1302 and the second electrodes 1304 is preferably 100 nm to 400 nm, more preferably 150 nm to 250 nm.

The first electrodes 1302 and the second electrodes 1304 can be formed using a conductive film including a semiconductor such as Si or Ge; a single-layer conductive film of a metal element such as Ag, Au, Cu, Ni, Pt, Pd, Ir, Rh, W, Al, Ta, Mo, Cd, Zn, Fe, Ti, Zr, Ba, or Nd; a stacked conductive film of a combination of a plurality of the above metal elements; a conductive film made of an alloy which includes the metal element as its main component (such as an aluminum-titanium alloy film); a conductive film made of metal nitride using the metal element; or the like. Alternatively, they may be formed using a conductive film of indium tin oxide (ITO), indium zinc oxide (IZO) formed using a target in which indium oxide containing silicon oxide is mixed with zinc oxide (ZnO) of 2 wt % to 20 wt %, indium tin oxide containing silicon oxide as a component (ITSO), or the like.

For either of the first electrodes 1302 or the second electrodes 1304 which are required to have a function as electrodes through which light obtained in the light emitting layer of the light emitting element is extracted, a material with high transmittance (for example, 40% or higher) with respect to visible light is preferably selected from the above materials to form either of the first electrodes 1302 or the second electrodes 1304. For electrodes through which light does not need to be extracted, a material with low transmittance (for example, lower than 10%) with respect to visible light or a material with high reflectance (for example, 40% or higher) is preferably selected from the above materials to form the electrodes.

Note that a light emitting element is formed in each position where the first electrode 1302 overlaps with the second electrode 1304 with the layer 1303 interposed therebetween (for example, a region a (1305) shown in FIG. 13A).

Figure 13B:
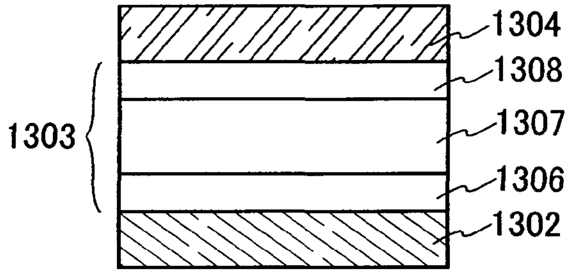

A structure of the light emitting element in the region a (1305) is shown in FIG. 13B. In other words, the layer 1303 interposed between the first electrodes 1302 and the second electrodes 1304 includes a first insulating film 1306, a layer 1307 including a light emitting layer and a carrier supply layer, and a second insulating film 1308.

Note that the first insulating film 1306 and the second insulating film 1308 are formed by a film formation method such as a CVD method or a sputtering method to have a single-layer or stacked structure using an insulating film containing silicon such as a silicon oxide (for example, $SiO_2$) film, a silicon nitride (for example, $Si_3N_4$) film, a silicon nitride oxide film, or a silicon oxynitride film, or an insulating film of metal oxide (for example, $Al_2O_3$ or $BaTiO_3$) or the like. Note that the thickness of each of the first insulating film 1306 and the second insulating film 1308 is 10 nm to 250 nm, preferably 100 nm to 200 nm.

Figure 13C:
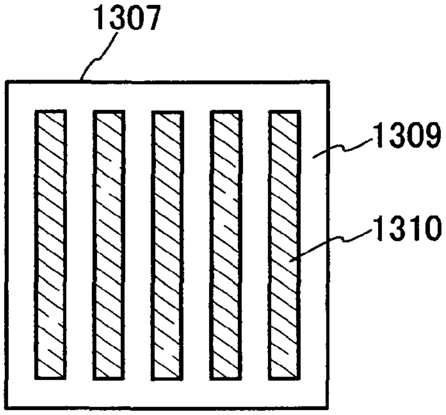
Figure 13D:
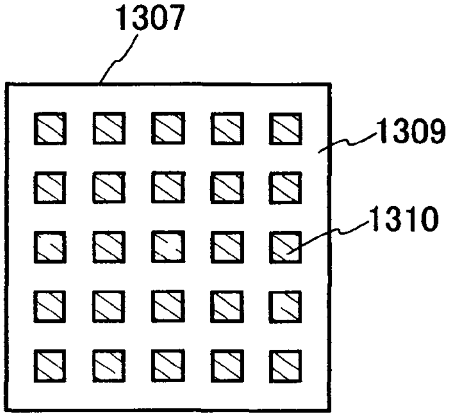

The layer 1307 including a light emitting layer and a carrier supply layer preferably has a structure as shown in FIG. 13C. In other words, the layer 1307 including a light emitting layer and a carrier supply layer preferably has a structure in which a plurality of carrier supply layers 1310 is separately formed in a light emitting layer 1309 and each distance between the adjacent carrier supply layers 1310 is short. For example, the layer 1307 preferably has a structure in which the carrier supply layers 1310 are formed in stripes as shown in FIG. 13C, or a structure in which the carrier supply layers 1310 are formed in matrix as shown in FIG. 13D.

Note that the light emitting layer 1309 and the carrier supply layers 1310 can be formed by a film formation method such as a CVD method or a sputtering method, and the thickness of each of them is preferably 50 nm to 300 nm, more preferably 100 nm to 200 nm.

The light emitting layer 1309 can be formed to include a base material that is a semiconductor and an additive material that is a light emitting center. Specific examples of the base material and the additive material can be the materials described in Embodiment Mode 4. Therefore, refer to the above description, and the explanation is omitted here.

The carrier supply layers 1310 can be formed using a semiconductor material which includes indium (In), aluminum (Al), gallium (Ga), silicon (Si), or the like as an n-type impurity element or nitrogen (N), phosphorus (P), zinc (Zn), or the like as a p-type impurity element.

Note that the structures shown in FIGS. 13C and 13D facilitate induction of carriers supplied from the carrier supply layers 1310 to an interface between the light emitting layer 1309 and the insulating film (the first insulating film 1306 or the second insulating film 1308) and can improve luminous efficiency of the light emitting element.

Embodiment Mode 7

Examples of electronic devices each having the light emitting device of the present invention are as follows: a television device (also referred to as simply a television, or a television receiver), a camera such as a digital camera or a digital video camera, a telephone set (simply also referred to as a telephone or a phone), an information terminal such as PDA, a game machine, a computer monitor, a computer, a sound reproducing device such as a car audio system or an MP3 player, an image reproducing device including a recording medium, such as a home-use game machine, and the like. Preferred modes of them are described with reference to FIGS. 14A to 14E.

Figure 14A:
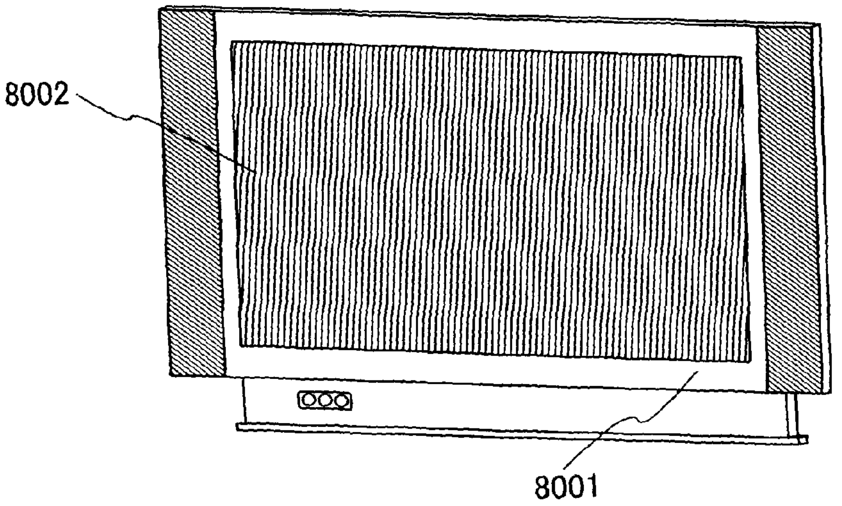
FIGS. 14A to 14E are diagrams illustrating electronic devices.

FIG. 14A shows a television device according to the present invention, which includes a main body 8001, a display portion 8002, and the like. In this television device, the light emitting device of the present invention including the light emitting element having features of not only high luminous efficiency and low drive voltage but also high resistance to deterioration is applied to the display portion 8002. Therefore, a television device which consumes less power and has higher reliability than a conventional one can be provided.

Figure 14B:
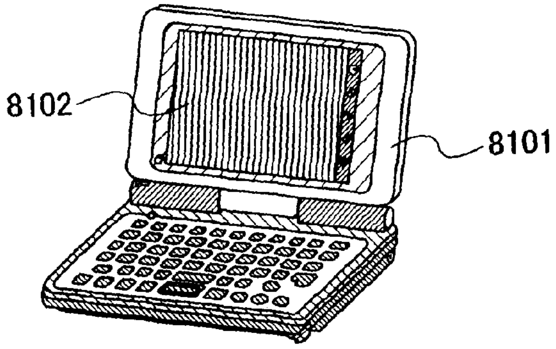

FIG. 14B shows an information terminal device according to the present invention, which includes a main body 8101, a display portion 8102, and the like. In this information terminal device, the light emitting device of the present invention including the light emitting element having features of not only high luminous efficiency and low drive voltage but also high resistance to deterioration is applied to the display portion 8102. Therefore, an information terminal device which consumes less power and has higher reliability than a conventional one can be provided.

Figure 14C:
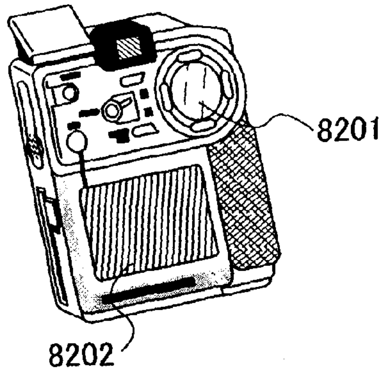

FIG. 14C shows a digital video camera according to the present invention, which includes a main body 8201, a display portion 8202, and the like. In this digital video camera, the light emitting device of the present invention including the light emitting element having features of not only high luminous efficiency and low drive voltage but also high resistance to deterioration is applied to the display portion 8202. Therefore, a digital video camera which consumes less power and has higher reliability than a conventional one can be provided.

Figure 14D:
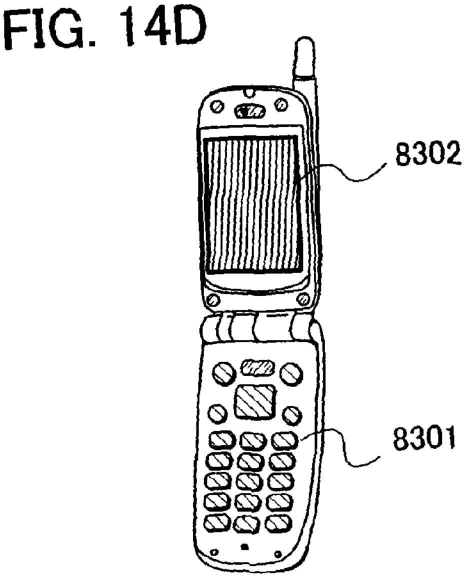

FIG. 14D shows a telephone according to the present invention, which includes a main body 8301, a display portion 8302, and the like. In this telephone, the light emitting device of the present invention including the light emitting element having features of not only high luminous efficiency and low drive voltage but also high resistance to deterioration is applied to the display portion 8302. Therefore, a telephone which consumes less power and has higher reliability than a conventional one can be provided.

Figure 14E:
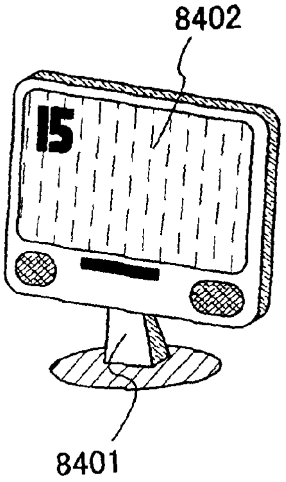
Figure 15:
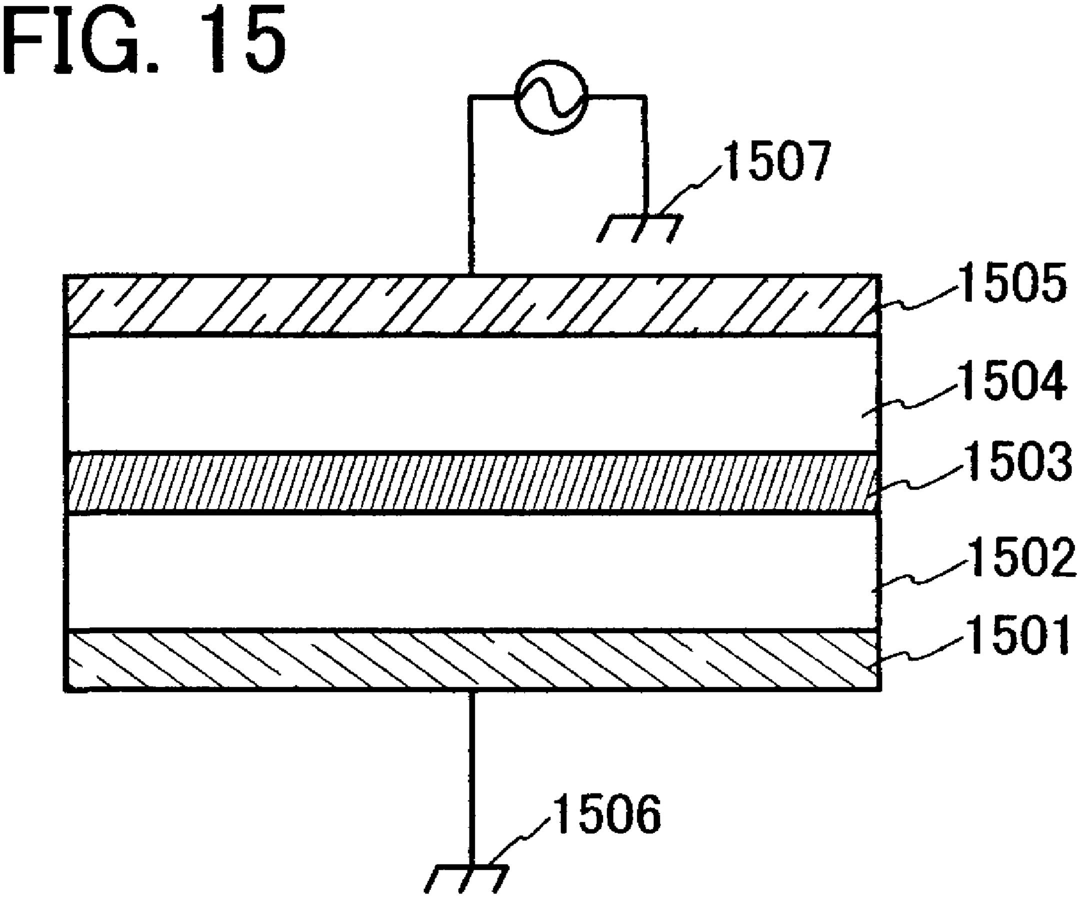
FIG. 15 is a diagram illustrating a conventional inorganic light emitting element.

FIG. 14E shows a liquid crystal monitor according to the present invention, which includes a main body 8401, a display portion 8402, and the like. In this liquid crystal monitor, the light emitting device of the present invention including the light emitting element having features of not only high luminous efficiency and low drive voltage but also high resistance to deterioration is applied to the display portion 8402 as a backlight. Therefore, a liquid crystal monitor which consumes less power and has higher reliability than a conventional one can be provided.

As described above, the applicable range of the light emitting device of the present invention is so wide that the light emitting device can be applied to electronic devices of various fields. With the use of the light emitting device of the present invention, an electronic device having a display portion which consumes less power and has high reliability can be provided.

This application is based on Japanese Patent Application serial no. 2006-043624 filed in Japan Patent Office on Feb. 21, 2006, the entire contents of which are hereby incorporated by reference.

What is claimed is:

1. A light emitting device comprising:
- a semiconductor layer of a transistor formed over a substrate;
- a first electrode electrically connected to the semiconductor layer of the transistor;
- a first insulating film formed over the first electrode;
- a light emitting layer formed over the first insulating film;
- a second insulating film formed over the light emitting layer;
- a second electrode formed over the second insulating film; and
- a first carrier supply layer and a second carrier supply layer interposed between the first and second insulating films,
- wherein the light emitting layer is directly in contact with upper and side surfaces of the first and second carrier supply layers,
- wherein the light emitting layer includes a base material and an additive material,
- wherein the first and second carrier supply layers comprise a semiconductor material including at least one of an n-type impurity element and a p-type impurity element, and
- wherein the semiconductor layer of the transistor includes a metal oxide.

2. The light emitting device according to claim 1, wherein the base material is one or more materials selected from the group consisting of a compound including a Group 2 element and a Group 16 element, a compound including a Group 12 element and a Group 16 element, a compound including a Group 13 element and a Group 15 element, a compound including a Group 2 element, a Group 13 element, and a Group 16 element, a compound including a plurality of Group 14 elements, and rare-earth sulfide.

3. The light emitting device according to claim 1, wherein the base material is one or more materials selected from the group consisting of calcium sulfide, strontium sulfide, barium sulfide, zinc sulfide, cadmium sulfide, zinc oxide, gallium nitride, strontium gallium sulfide, magnesium zinc oxide, silicon carbide, and yttrium sulfide.

4. The light emitting device according to claim 1, wherein the additive material is one or more materials selected from transition metal elements and rare-earth elements.

5. The light emitting device according to claim 1, wherein the additive material is one or more materials selected from the group consisting of cerium, praseodymium, samarium, europium, terbium, thulium, chromium, iron, cobalt, nickel, copper, silver, gold, platinum, and manganese.

6. The light emitting device according to claim 1, wherein the first and second carrier supply layers comprise a material selected from the group consisting of zinc sulfide to which indium is added, zinc oxide to which aluminum or gallium is added, gallium nitride to which silicon is added, zinc oxide to which nitrogen or phosphorus is added, and gallium nitride to which zinc is added.

7. An electronic device comprising the light emitting device according to claim 1 in a display portion.

8. A light emitting device comprising:
- a semiconductor layer of a transistor formed over a substrate;
- a first electrode electrically connected to the semiconductor layer of the transistor;
- a first insulating film formed over the first electrode;
- a light emitting layer formed over the first insulating film;
- a second insulating film formed over the light emitting layer;
- a second electrode formed over the second insulating film; and
- a plurality of carrier supply layers interposed between the first and second insulating films,
- wherein the light emitting layer is interposed between the plurality of carrier supply layers,
- wherein the light emitting layer is directly in contact with upper and side surfaces of the plurality of carrier supply layers, wherein the light emitting layer includes a base material and an additive material, wherein the plurality of carrier supply layers comprise a semiconductor material including at least one of an n-type impurity element and a p-type impurity element, and wherein the semiconductor layer of the transistor includes a metal oxide.

9. The light emitting device according to claim 8, wherein the base material is one or more materials selected from the group consisting of a compound including a Group 2 element and a Group 16 element, a compound including a Group 12 element and a Group 16 element, a compound including a Group 13 element and a Group 15 element, a compound including a Group 2 element, a Group 13 element, and a Group 16 element, a compound including a plurality of Group 14 elements, and rare-earth sulfide.

10. The light emitting device according to claim 8, wherein the base material is one or more materials selected from the group consisting of calcium sulfide, strontium sulfide, barium sulfide, zinc sulfide, cadmium sulfide, zinc oxide, gallium nitride, strontium gallium sulfide, magnesium zinc oxide, silicon carbide, and yttrium sulfide.

11. The light emitting device according to claim 8, wherein the additive material is one or more materials selected from transition metal elements and rare-earth elements.

12. The light emitting device according to claim 8, wherein the additive material is one or more materials selected from the group consisting of cerium, praseodymium, samarium, europium, terbium, thulium, chromium, iron, cobalt, nickel, copper, silver, gold, platinum, and manganese.

13. The light emitting device according to claim 8, wherein the carrier supply layers comprise a material selected from the group consisting of zinc sulfide to which indium is added, zinc oxide to which aluminum or gallium is added, gallium nitride to which silicon is added, zinc oxide to which nitrogen or phosphorus is added, and gallium nitride to which zinc is added.

14. An electronic device comprising the light emitting device according to claim 8 in a display portion.

15. The light emitting device according to claim 1, wherein the semiconductor layer of the transistor includes zinc.

16. The light emitting device according to claim 1, wherein the metal oxide is zinc oxide.

17. The light emitting device according to claim 8, wherein the semiconductor layer of the transistor includes zinc.

18. The light emitting device according to claim 8, wherein the metal oxide is zinc oxide.

* * * * *